(12) United States Patent
Yang

(10) Patent No.: US 12,286,715 B2
(45) Date of Patent: Apr. 29, 2025

(54) HETEROSTRUCTURED THIN-FILM CATALYSTS COMPRISING NANOCAVITIES

(71) Applicant: UNIVERSITY OF CENTRAL FLORIDA RESEARCH FOUNDATION, INC., Orlando, FL (US)

(72) Inventor: Yang Yang, Orlando, FL (US)

(73) Assignee: UNIVERSITY OF CENTRAL FLORIDA RESEARCH FOUNDATION, INC., Orlando, FL (US)

(*) Notice: Subject to any disclaimer, the term of this patent is extended or adjusted under 35 U.S.C. 154(b) by 558 days.

(21) Appl. No.: 17/470,472

(22) Filed: Sep. 9, 2021

(65) Prior Publication Data
US 2022/0064809 A1    Mar. 3, 2022

Related U.S. Application Data

(62) Division of application No. 16/262,310, filed on Jan. 30, 2019, now Pat. No. 11,131,033.
(Continued)

(51) Int. Cl.
*B01J 21/06*       (2006.01)
*B01J 23/00*       (2006.01)
(Continued)

(52) U.S. Cl.
CPC ............ *C25B 11/091* (2021.01); *B01J 21/063* (2013.01); *B01J 23/002* (2013.01); *B01J 23/02* (2013.01); *B01J 35/647* (2024.01); *B01J 35/651* (2024.01); *B01J 35/66* (2024.01); *C23C 14/16* (2013.01); *C23C 14/18* (2013.01); *C23C 14/30* (2013.01); *C23C 14/5866* (2013.01); *C25B 1/04* (2013.01); *C25B 1/55* (2021.01); *C25B 9/17* (2021.01); *C25B 11/051* (2021.01); *C25D 11/26* (2013.01); *H01L 31/022425* (2013.01)

(58) Field of Classification Search
CPC ............. B01J 21/063; C25B 1/55; C25B 1/04
See application file for complete search history.

(56) References Cited

U.S. PATENT DOCUMENTS 11,131,033 B2   9/2021   Yang
2009/0117384 A1  5/2009   Han

OTHER PUBLICATIONS

Grimes, Synthesis and application of highly ordered arrays of TiO2 nanotubes, J. Mater. Chem., 2007, 17, 1451-1457 (Year: 2007).*
(Continued)

*Primary Examiner* — Anthony J Zimmer
*Assistant Examiner* — Eric Scott Sherman
(74) *Attorney, Agent, or Firm* — Timothy H. Van Dyke; Wolter Van Dyke Davis, PLLC

(57) ABSTRACT

A heterostructured catalyst includes a 2-dimensional (2D) array of titanium including nanocavities that are all directly attached to a substrate. Each of the titanium including nanocavities have a pore with a nanopore size and a wall with a nanowall thickness. The titanium including nanocavities can be titania nanocavities with a metal layer or a metal compound layer on the titania nanocavities including inside the pores, or the titanium including nanocavities can include $SrTiO_3$ or consist of $SrTiO_3$, each with a surface layer of reduced $SrTiO_3$.

5 Claims, 11 Drawing Sheets

Related U.S. Application Data

(60) Provisional application No. 62/625,068, filed on Feb. 1, 2018.

(51) Int. Cl.

| | | |
|---|---|---|
| *B01J 23/02* | (2006.01) | |
| *B01J 35/64* | (2024.01) | |
| *B01J 35/66* | (2024.01) | |
| *C23C 14/16* | (2006.01) | |
| *C23C 14/18* | (2006.01) | |
| *C23C 14/30* | (2006.01) | |
| *C23C 14/58* | (2006.01) | |
| *C25B 1/04* | (2021.01) | |
| *C25B 1/55* | (2021.01) | |
| *C25B 9/17* | (2021.01) | |
| *C25B 11/051* | (2021.01) | |
| *C25B 11/091* | (2021.01) | |
| *C25D 11/26* | (2006.01) | |
| *H01L 31/0224* | (2006.01) | |

(56) References Cited

OTHER PUBLICATIONS

Bi, et al, Photoreduction of CO2 on TiO2/SrTiO3 Heterojunction Network Film, Nanoscale Research Letters (2015), 10, 345 (Year: 2015).*

Xie, et al, Self-doped SrTiO3-d photocatalyst with enhanced activity for artificial photosynthesis under visible light, Energy Environ. Sci., 2011, 4, 4211 (Year: 2011).*

He, et al, "MoS2/TiO2 edge-on heterostructure for efficient photocatalytic hydrogen evolution." Advanced Energy Materials 6.14 (2016) (Year: 2016).*

Zhao, et al., One-dimensional MoS2-decoarated TiO2 nanotube gas sensors for efficient alcohol testing, Journal of Alloys and Compounds, 674 (2016), 252-258 (Year: 2016).*

Grimes, Craig A., "Synthesis and application of highly ordered arrays of TiO2 nanotubes", J. Mater. Chem., vol. 17, 2007, pp. 1451-1457.

Guo, L et al., "MoS2/TiO2 Heterostructers as Nonmetal Plasmonic Photocatalysts for Highly Efficient Hydrogen Evolution", Energy Environ. Sci., 2017, 11 pages.

Li, Zhao et al., "Drastic enhancement of photoelectrochemical water splitting performance over plasmonic Al@TiO2 heterostructured nanocavity arrays", Nano Energy, No. 51, 2018, pp. 400-407.

Shi, Li et al., "Periodically Ordered Nanoporous Perovskite Photoelectrode for Efficient Photoelectrochemical Water Splitting", ACS Nano, 2018, vol. 12, pp. 6335-6342.

Tian, Yuanyuan et al., "Enhanced photo-assistant electrocatalysis of anodization TiO2 nanotubes via surrounded surface decoration with MoS2 hydrogen evolution reaction", Applied Surface Science, vol. 433, 2018, pp. 197-205.

Weickert, Jonas et al, "Controlled Growth of TiO2 Nanotubes Conducting Glass", Chem. Matter., 2011, vol. 23, pp. 155-162.

Zhou, Xuemei et al., "Thin MoS2 on TiO2 nanotube layers: An efficient co-catalyst/harvesting system for photocatalytic H2 evolution", Electrochemistry Communications, vol. 73, 2016, pp. 33-37.

* cited by examiner

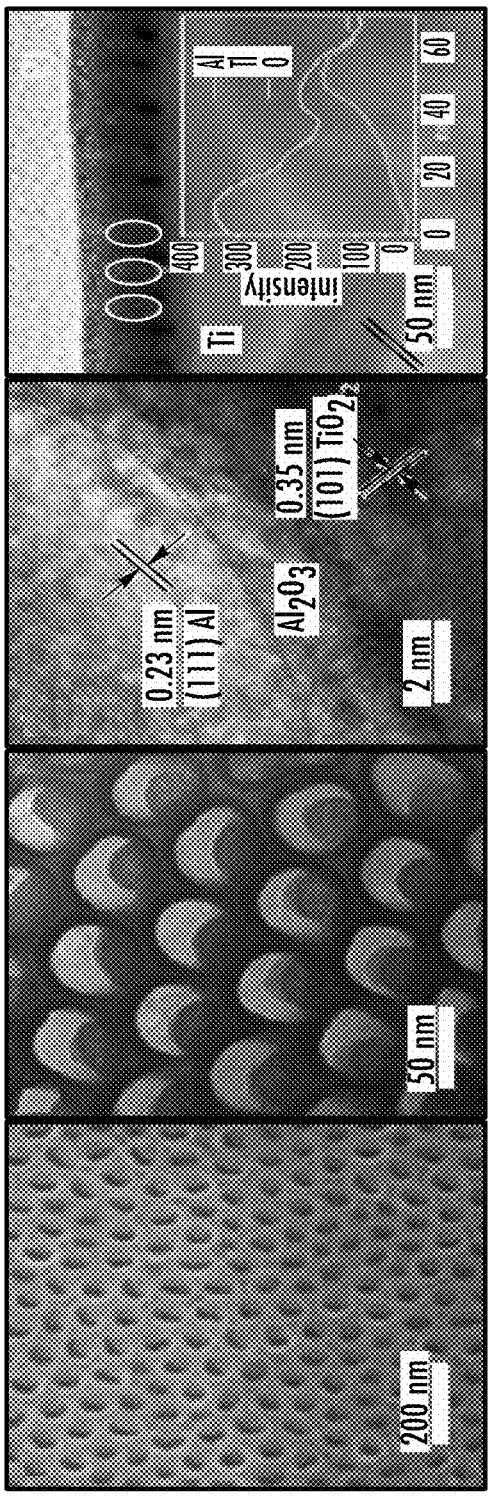
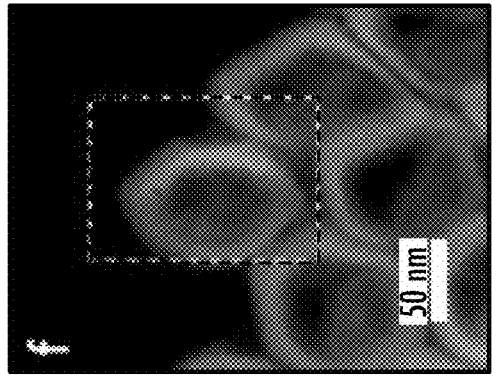
FIG. 9A  FIG. 9B  FIG. 9C  FIG. 9D  FIG. 9E

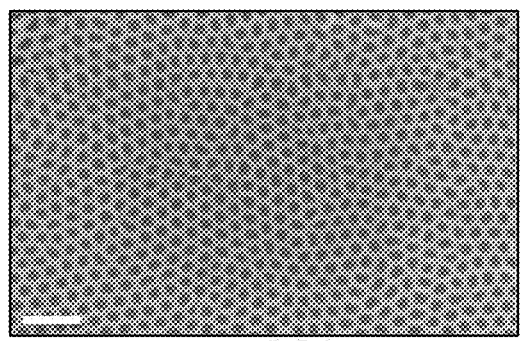
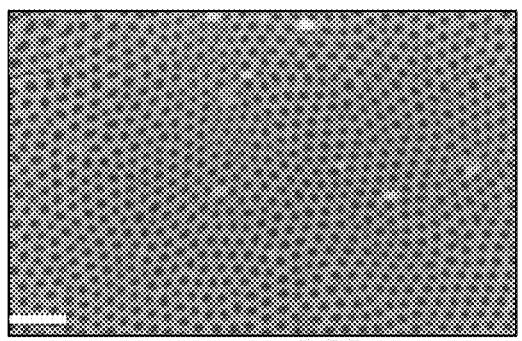
FIG. 12A    FIG. 12B
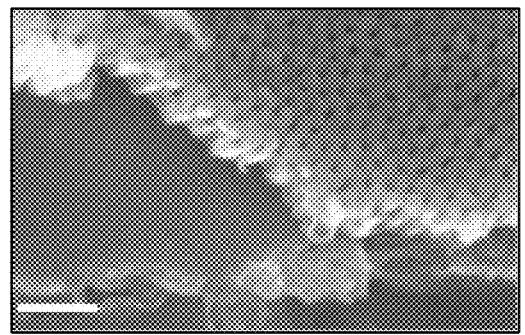
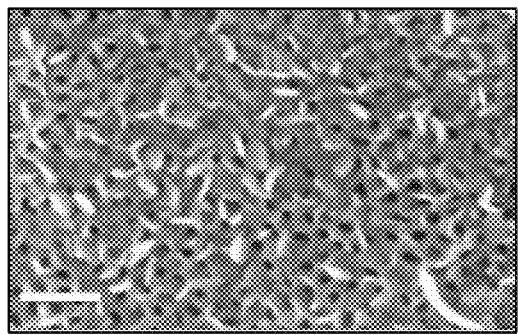
FIG. 12C    FIG. 12D
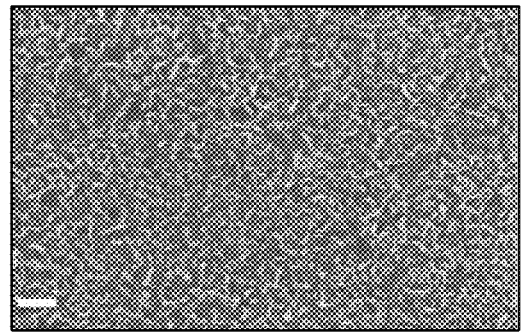
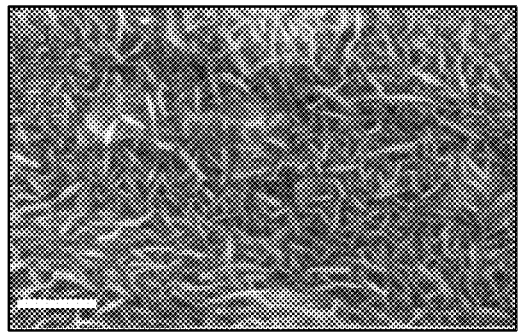
FIG. 12E    FIG. 12F
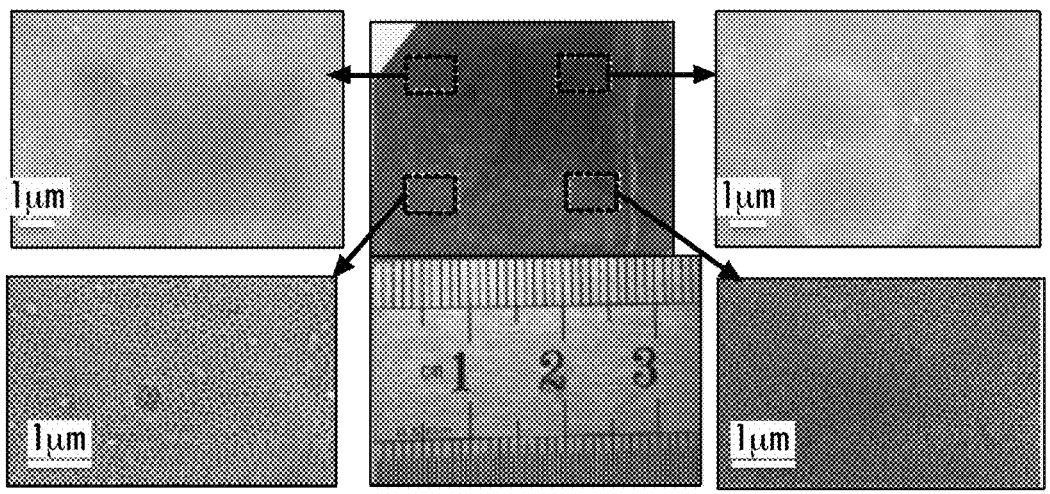
FIG. 12G

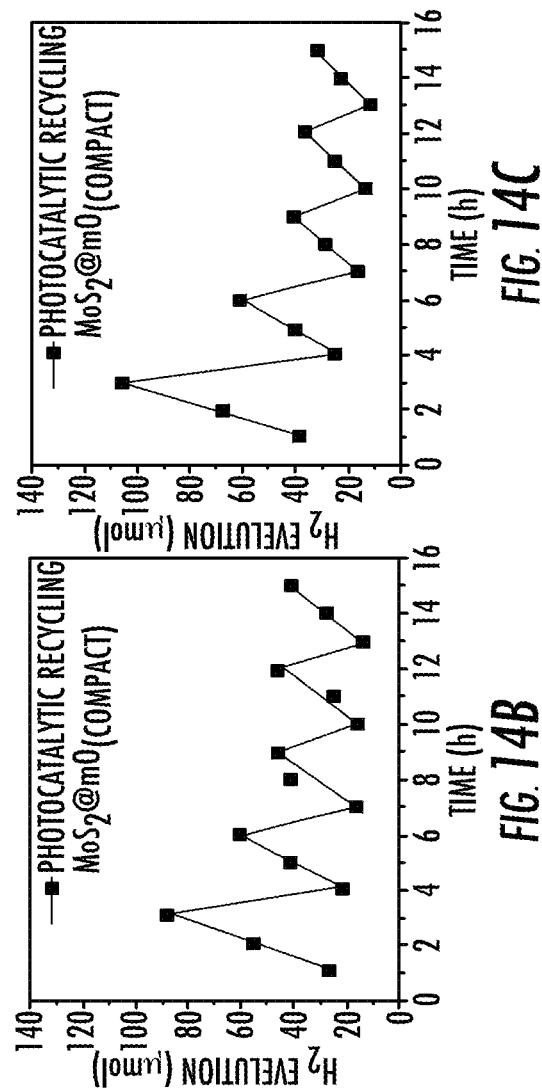
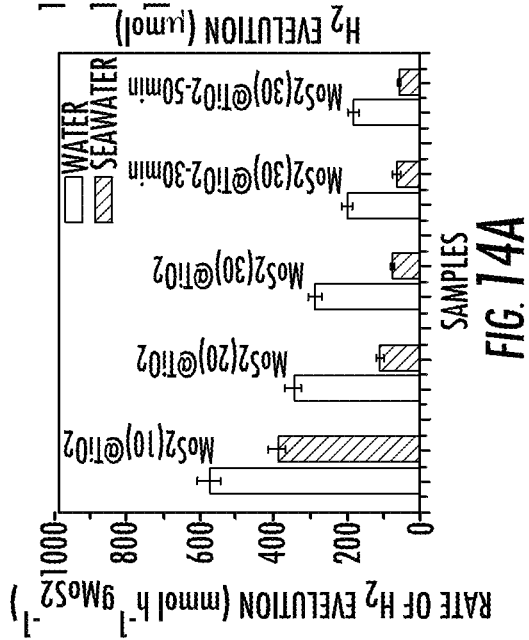
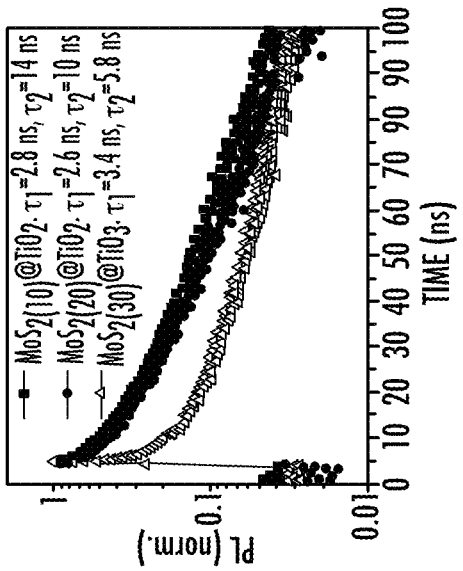
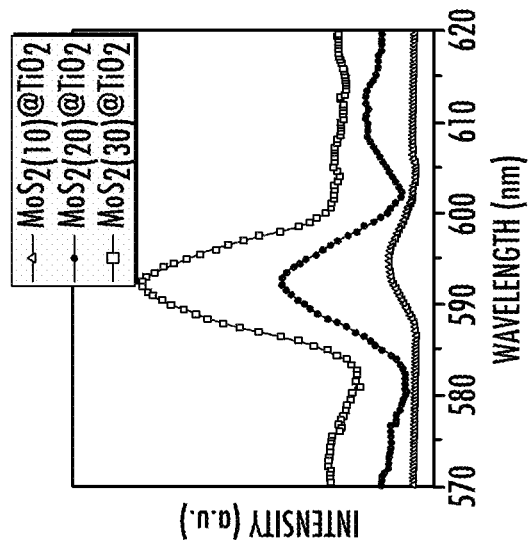

HETEROSTRUCTURED THIN-FILM CATALYSTS COMPRISING NANOCAVITIES

FIELD

Disclosed embodiments relate to heterostructured thin film catalysts that include cavities.

BACKGROUND

A significant amount of research recently has focused on solar energy conversion to provide clean combustible chemical fuels ($H_2$, $CH_4$, etc.) to address a future impending global energy crisis as well as hazardous environmental pollution conditions largely induced by fossil fuel consumption. Solar-to-fuel conversion significantly depends on semiconductor materials that can harvest photon energy across the wide solar spectrum (from ultraviolet (UV) to near-infrared (NIR) region) and simultaneously generate charge-carriers on the suitable energy levels for $H^+$ reduction. Among various semiconductor materials and technologies, low-cost, nontoxic, and chemical stable $TiO_2$ (titania) has long been studied as a promising photocatalyst for solar-driven water splitting. However, the main disadvantages of a wide band gap and sluggish charge transfer kinetics of $TiO_2$ has limited its feasibility within the visible light region, which accounts for approximately 43% of the power output of the solar spectrum.

It is possible to generally overcome these issues with using $TiO_2$ by a variety of techniques, including heavily doping (e.g., doping with nitrogen), integrating narrow band gap semiconductors, and decorating with noble metals and co-catalysts (CdS, CdSe, Pt, Au, Ag), to broaden the passive oxide semiconductor absorption range to include visible or near infrared (NIR), creating a more efficient photocatalysts. However, the widespread use of scarce noble metals is not considered a reasonable option due to their high cost and potential to be environmentally toxic.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a heterostructured catalyst comprising a 2-dimensional (2D) array of titanium comprising nanocavities that are all directly attached to a substrate, wherein each of the nanocavities have a pore with a nanopore size and a wall with a nanowall thickness. The nanocavities can comprise $TiO_2$ nanocavities and there is a metal layer or a metal compound layer on the titania nanocavities, or the nanocavities can consist of $SrTiO_3$. The metal layer or a metal compound layer on the titania nanocavities can comprise $MoS_2$, $SrTiO_3$ or a variety of different metals or metal alloys. The 2D array of titanium comprising nanocavities is generally a periodically ordered array having an interval of the periodicity (center-to-center) of 10 nm to 100 nm with a distribution all within ±1 nm of a mean interval value, the nanopore size is 10 to 200 nm with a distribution all with ±1 nm of a mean pore size value, and the nanowall thickness is 5 nm to 20 nm with a distribution all within ±0.5 nm of a mean wall thickness value.

Disclosed a heterostructured catalysts have applications including for solar cells and for sunlight-driven hydrogen ($H_2$) production from water (e.g., seawater) which is considered an ultimate solution to the energy and environmental crisis. Solar fuel cells including disclosed heterostructured catalysts are also disclosed.

Disclosed aspects also include a method for forming a thin film heterostructure catalyst including anodizing to oxidize a titanium surface on a substrate to form a 2D array of titania nanocavities, and then forming a metal layer or a metal compound layer on the titania nanocavities, or converting the titania nanocavities into $SrTiO_3$ nanocavities.

BRIEF DESCRIPTION OF THE DRAWINGS

FIGS. 6C and 6D are cross-sectional scanned SEM images of $TiO_2$ and r-$SrTiO_3$, respectively. FIG. 6E is a scanned TEM image of r-$SrTiO_3$. FIG. 6F is a scanned STEM image and corresponding elemental mapping of r-$SrTiO_3$ (left to right: Ti, Sr, O). FIG. 6G is a scanned HRTEM image of r-$SrTiO_3$. The scale bars in FIGS. 6A and 6B are 200 nm, and the scale bars in FIGS. 6C, 6D, and 6F are 100 nm, in FIG. 6E the scale bar is 50 nm, and in FIG. 6G the scale bar is 5 nm.

FIG. 7B is a visible light absorption spectra of the original r-SrTiO3 and recovered r-$SrTiO_3$. The recovered r-$SrTiO_3$ was obtained by NaBH4 reduction of the oxidized r-SrTiO3. FIG. 7C shows incident angle-dependent light absorption spectra of r-SrTiO3. FIG. 7D is a schematic illustration of the incident angle-dependent light absorption measurement.

FIG. 8B, and FIG. 8C are transient photocurrent responses of SrTiO3 and r-SrTiO3 photoelectrodes at 1.23 V vs. RHE under AM 1.5G illumination without and with a L-42 cutoff filter ($\lambda \geq 420$ nm), respectively. FIG. 8D shows IPCE spectra in the region of 430-730 nm at 1.23 V vs. RHE. FIG. 8E is a schematic illustration of a disclosed mechanism of r-SrTiO3 for photoelectrochemical (PEC) water splitting under visible light.

FIGS. 9A-E include FIG. 9A and FIG. 9B showing scanned SEM and TEM images of 20 nm thick aluminum on $TiO_2$ nanocavities represented herein as $Al20@TiO_2$, respectively. FIG. 9C is a scanned HRTEM image of $Al20@TiO_2$. FIG. 9D is a cross sectional STEM image of $Al20@TiO_2$ (where the inset shows the linear energy dispersive spectroscopy (EDS) profile captured from the dashed line, and the Al NPs are highlighted by dashed circles). FIG. 9E is a scanned STEM image and the corresponding EDS mapping of $Al20@TiO_2$.

FIG. 10C is a high-resolution XPS of Al in the $Al20@TiO_2$. FIG. 10D is a UV-vis absorption spectra of $TiO_2$, $Al10@TiO_2$, $Al20@TiO_2$, and $Al30@TiO_2$. FIG. 10E is an incident angle-dependent light absorption spectra of $Al20@TiO_2$. FIG. 10F is a finite difference time domain FDTD simulation of $Al20@TiO_2$ as a function of incident angle.

FIG. 11D shows the photoconversion efficiency as a function of external potential. FIGS. 11E, 11F show IPCE and electrochemical impedance spectroscopy of $TiO_2$, Al10 $@TiO_2$, Al20 $@TiO_2$, and Al30 $@TiO_2$.

FIGS. 12A-G include FIG. 12A comprising a SEM image of as-anodized $TiO_2$ nanocavity arrays and FIG. 12B after e-beam deposition of 30 nm Mo; FIG. 12C is a cross-sectional view of 30 nm thick $MoS_2$ on $TiO_2$ nanocavities represented as $MoS_2(30)@TiO_2$ (the number after $MoS_2$ used herein is its thickness in nm); FIG. 12D shows 10 nm Mo sulfurized for 360 min on $TiO_2$ nanocavity; FIG. 12E shows 10 nm Mo sulfurized for 10 min on a Ti foil; FIG. 12F shows a Mo foil sulfurized for 10 min (Scale bars: 200 nm); and FIG. 12G shows a scanned photograph and morphologies of $MoS_2(10)@TiO_2$ at different sample locations.

FIG. 13B is a UV-vis absorption spectra of 30 nm thick $MoS_2$, referred to as $MoS_2(30)$. $TiO_2$ sulfurized at 400° C. for 10, 30, 50 min which shows that the photocatalyst displays weakening absorption in the visible-light region with increasing sulfurization time, which is caused by the complementary of S in $MoS_2$ crystal and reducing S defects. FIG. 12C is a SERS spectra of 4-MBA recorded from different $MoS_2@TiO_2$ systems.

FIGS. 14A-E include FIG. 14A comprising a $H_2$ evolution rate over $MoS_2@TiO_2$ films to $MoS_2$ mass loading (Photocatalytic activity to seawater is inserted following. All testing carried out under simulated solar light). FIGS. 14B, and 14C show recycling photocatalytic $H_2$ evolution test of $MoS_2(30)@TiO_2$(compact) and $MoS_2@Mo$(compact) over 15 h. FIG. 14D and FIG. 14E show a photoluminescence (PL) spectra of $MoS_2@TiO_2$ cocatalysts at steady state and time-resolved transient PL decay, with charge-carriers lifetime, inserted accordingly.

DETAILED DESCRIPTION

Figure 1:
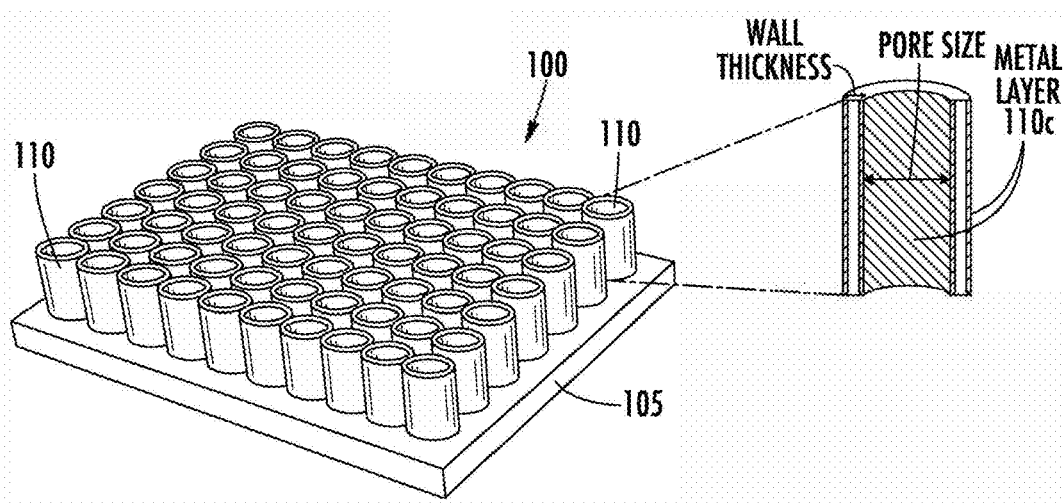
FIG. 1 is a perspective depiction of an example heterostructured catalyst comprising a 2D array of titania nanocavities that are all directly attached to a substrate, wherein each of the nanocavities have a pore with a nanopore size and a wall with a nanowall thickness, and where there is a metal layer or a metal compound layer on the titania nanocavities. A blow-up depiction of one the nanocavities is also provided that shows the nanopore size, the nanowall thickness, and the metal layer thereon.

Disclosed embodiments are described with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships, and methods are set forth to provide a full understanding of the embodiments disclosed herein.

One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 is a perspective depiction of an example heterostructured catalyst 100 comprising a 2D array of titania nanocavities 110 that are all directly attached to a substrate 105, wherein each of the nanocavities 110 have a pore with a nanopore size and a wall with a nanowall thickness. The substrate 105 can comprise a silicon wafer, a glass wafer, or a conducting polymer.

There is a metal layer or a metal compound layer 110c on the titania nanocavities 110. A blow-up depiction of one the nanocavities 110 is also provided that shows dimensions representing the nanopore size, the nanowall thickness, and the metal layer 110c on the titania nanocavities 110, which shows the metal layer 110c being on the outside surface and the inside surface of titania nanocavity 110.

The metal layer or a metal compound layer 110c on the titania nanocavities 110 can comprise metal compounds such as $MoS_2$, or $SrTiO_3$, or a variety of metals or metal alloys such as Al, Cu, Au, Ag, Pt, or their alloys. The 2D array of titania nanocavities 110 are shown as being hollow cylindrical shaped cells that are generally positioned like a crystal lattice including a highly periodically ordered array. The interval of the periodicity is generally 10 nm to 100 nm with a distribution all within ±1 nm of a mean interval value, the nanopore size is generally 10 nm to 200 nm with a distribution all with ±1 nm of a mean pore size value, and the nanowall thickness is generally 5 nm to 20 nm such as 10 nm to 15 nm with a distribution all within ±0.5 nm of a mean wall thickness value.

It has been found that disclosed heterostructured catalysts exhibit enhanced light absorption in a broad range of the solar spectrum, such as from the ultraviolet (UV) light region to the visible and near-IR light regions (generally in a range of 300 nm to 700 nm) which may be induced by a mechanism comprising the plasmonic effect and intrinsic optical resonance of the respective materials. The mechanism disclosed herein believed to be accurate is however not needed to practice disclosed aspects is that disclosed metal compound nanocavities, such as comprising $TiO_2$ or $SrTiO_3$, can absorb UV-light, the heterostructure metal or metal compound (e.g., Al or reduced $SrTiO_3$) can absorb visible light, and metal compounds such as $MoS_2$ or $Ni(OH)_2$ can absorb visible and near-IR light.

FIGS. 2A-D depict the in-process structures corresponding to steps for an example heterostructured catalyst where the titania nanocavities are converted to $SrTiO_3$ nanocavities, which are then reduced at the surface to form r-$SrTiO_3$ surface. This embodiment recognizes plasmon resonance (LSPR) have a high potential for solar energy harvesting applications. Exploring nonmetallic plasmonic materials is desirable yet challenging. Herein, an efficient nonmetallic plasmonic perovskite photoelectrode, namely, $SrTiO_3$, with a periodically ordered 2D nanoporous structure showing an intense LSPR in the visible light region is disclosed. The crystalline-core@amorphous-shell structure of the $SrTiO_3$ photoelectrode enables a strong LSPR due to the high charge carrier density induced by oxygen vacancies in the amorphous shell. The reversible tunability in LSPR of the $SrTiO_3$ photoelectrode was observed by oxidation/reduction treatment and incident angle adjusting. Such a nonmetallic plasmonic $SrTiO_3$ photoelectrode displays a large plasmon-enhanced photoelectrochemical water splitting performance with a photocurrent density of 170.0 $\mu A\ cm^{-2}$ under visible light illumination and a maximum incident photon-to-current-conversion efficiency of 4.0% in the visible light region, which are comparable to the state-of-the-art plasmonic noble metal sensitized photoelectrodes. FIGS. 2A-2D are described in further detail below.

FIGS. 3A-D depict the in-process structures corresponding to steps in forming a disclosed heterostructure catalyst, where the metal layer or a metal compound layer on the titania nanocavities comprises aluminum which is used only as an example of a metal or metal alloy coating. This embodiment comprises Al on titiania naoncavities (abbreviated as Al@$TiO_2$) heterostructures for efficient PEC water splitting by controllably isolating Aluminum (Al) nanoparticles (NPs) individually into disclosed $TiO_2$ nanocavity arrays (NCAs). Compared with bare $TiO_2$, Al@$TiO_2$ shows enhanced PEC performance under solar light illumination. The significantly enhanced PEC activity of an Al@$TiO_2$ photoanode is attributed to the LSPR induced electromagnetic field enhancement in UV-visible region and photoinduced hot carrier of Al NPs. Moreover, the naturally formed $Al_2O_3$ thin surface layer formed in air at room temperature sometimes termed a native oxide can act as a protective layer by restraining Al NPs corrosion and reducing the surface charge recombination. This aspect evidences that a novel plasmonic system can be rationalized by forming isolated earth-abundant metal into the nanostructured semiconductor film with a highly ordered morphology, which is believed to open a new paradigm for an advanced catalyst design for PEC water splitting. FIGS. 3A-3D are described in further detail below.

Figure 4:
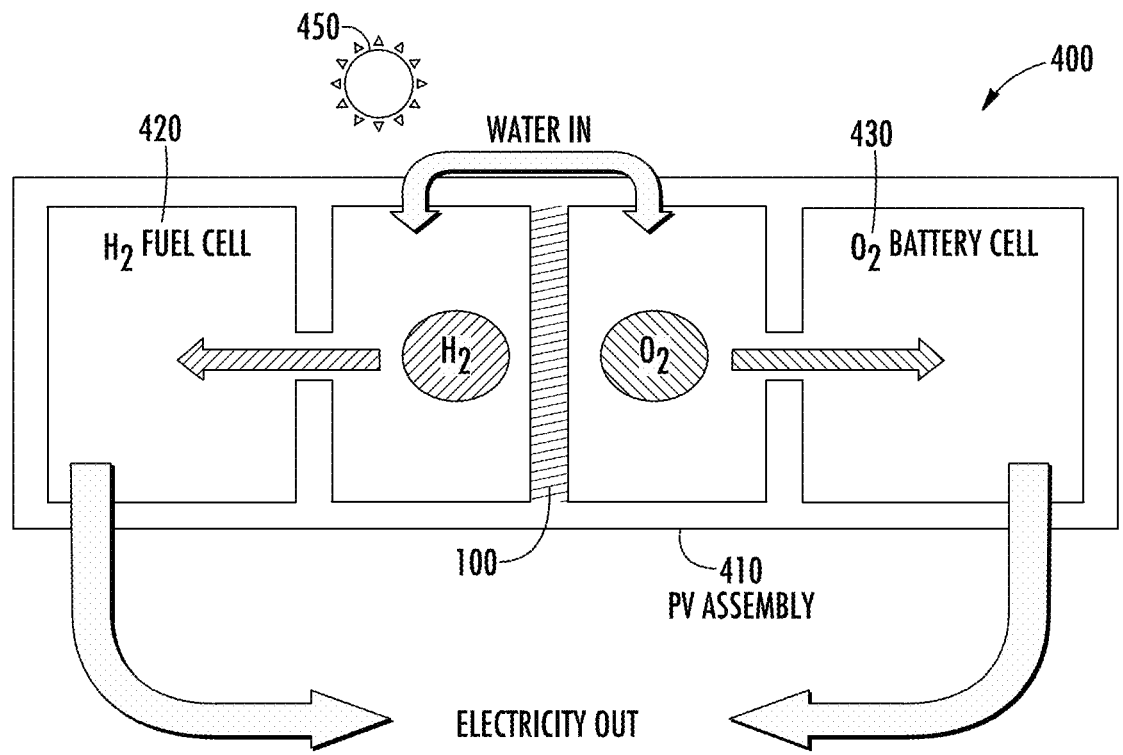
FIG. 4 depicts a solar fuel cell that includes a solar $H_2$ and $O_2$ generation chamber in the middle coupled with a $H_2$ fuel cell on the left and an $O_2$ battery cell on the right.

FIG. 4 depicts a solar fuel cell 400 that includes a disclosed heterostructured catalyst shown as 100 on an anode of a PV assembly 410 comprising solar cell(s) including an active region comprising a p-type material and an n-type material positioned between the anode and a cathode, where the heterostructured catalyst 100 in operation is exposed to sunlight 450. The substrate of the heterostructured catalyst shown as 100 is electrically conductive and is used to make a connection with the external circuit, acting like a current collector. The solar fuel cell 400 converts light from the sun shown as 450 to run the electron and proton flow in reverse as compared to a conventional solar cell or solar module inclising a plurality of solar cells. Coupling the photogenerated electrons and protons from the PV cell(s) to the heterostructured catalyst 100 breaks the OH bonds of water ($H_2O$) supplied which generates $H_2$ and $O_2$. The $H_2$ is shown used as a chemical fuel in the $H_2$ fuel cell 420. $O_2$ is used as a chemical fuel shown used by an $O_2$ battery cell 430 (e.g., a lithium-$O_2$ battery). The $H_2$ fuel cell 420 and $O_2$ battery cell 430 each are shown generating electricity both shown providing electricity out.

Figure 5:
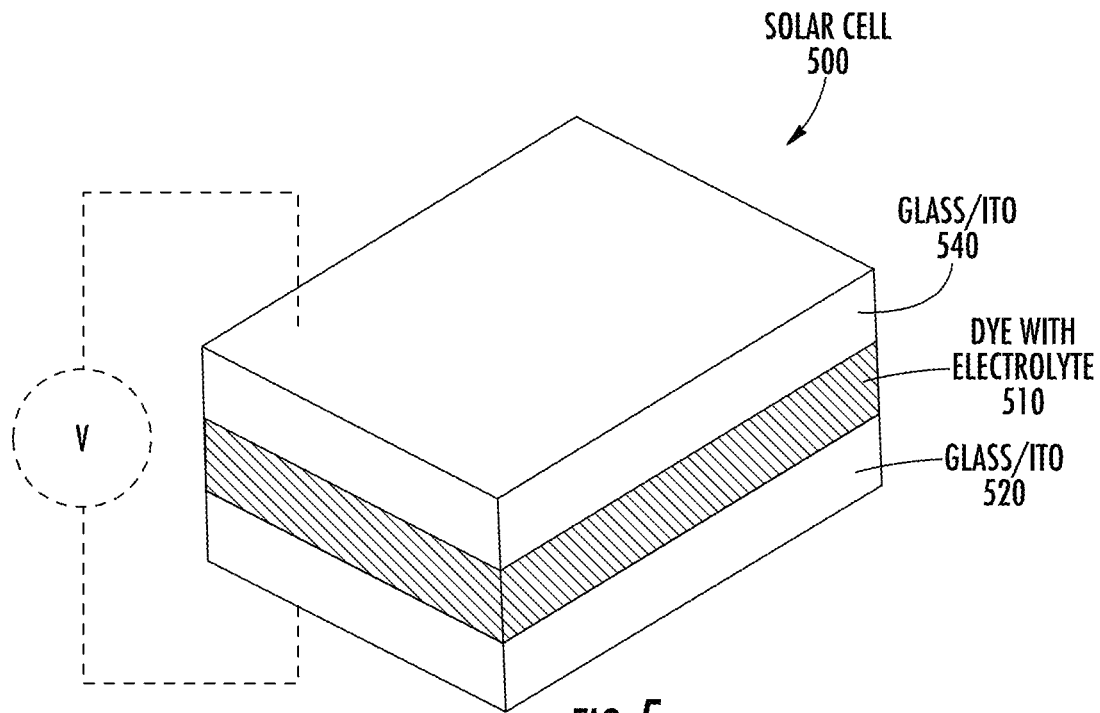
FIG. 5 depicts a solar cell that includes a disclosed heterostructured catalyst.

FIG. 5 depicts a solar cell shown by example as a solar dye cell 500 that includes a disclosed heterostructured catalyst 100. The electrical power generated by the solar dye cell 500 is shown as a voltage represented as V'''. The heterostructured catalyst 100 is positioned between the dye with electrolyte 510 and the bottom glass/Indium tin oxide (ITO) layer 520 that generally has a Pt or a graphite coating. Above the dye with electrolyte 510 is a top glass/ITO layer 540 that generally also has a Pt or a graphite coating. The glass/ITO 540 that generally has a Pt or a graphite coating functions as a counter electrode and the heterostructured catalyst 100 functions as a working electrode, which are separated from one another by the dye with electrolyte 510. No membrane is needed by the solar dye cell 500.

A disclosed aspect with a metal compound on the nanocavities or being the entire nanocavities is now described as being $SrTiO_3$. $H_2$ production via PEC splitting of water has been developed as a technology for solar energy harvesting. The development of efficient photoanodes is needed for practical PEC applications. However, most recently developed photoanodes still suffer from unsatisfactory solar energy conversion efficiencies, largely due to their insufficient light absorption, low charge separation, and low transfer efficiencies. One effective strategy for expanding the light absorption and improving the efficiencies is to combine the photoanodes with plasmonic noble metals due to the LSPR. For example, dramatically plasmon-enhanced PEC water splitting performances have been achieved over some photoanodes, such as $TiO_2$, $BiVO_4$, and ZnO, via decorating them with plasmonic Au nanostructures. However, the plasmonic metals, especially noble metals, are rare and are expensive, which limit their wide applications.

A disclosed aspect is a plasmonic $SrTiO_3$ photoelectrode with a periodically ordered nanoporous structure formed by hydrothermally converting a $TiO_2$ nanoporous film comprising a 2D array of nanocavities, that is followed by a reduction process. The as-prepared surface reduced $SrTiO_3$ (r-SrTiO3) that has a crystalline-core@amorphous-shell structure with abundant oxygen vacancies in the amorphous shell can absorb visible light due to the LSPR property. The reversible tunability in the plasmonic resonance of r-$SrTiO_3$ can be observed through a simple oxidation/reduction process and adjusting the incident angles. Such an r-$SrTiO_3$ photoelectrode exhibits a dramatically enhanced PEC water splitting performance compared with a pristine $SrTiO_3$ photoelectrode under visible light irradiation.

Figures 2A, 2B, 2C, 2D:
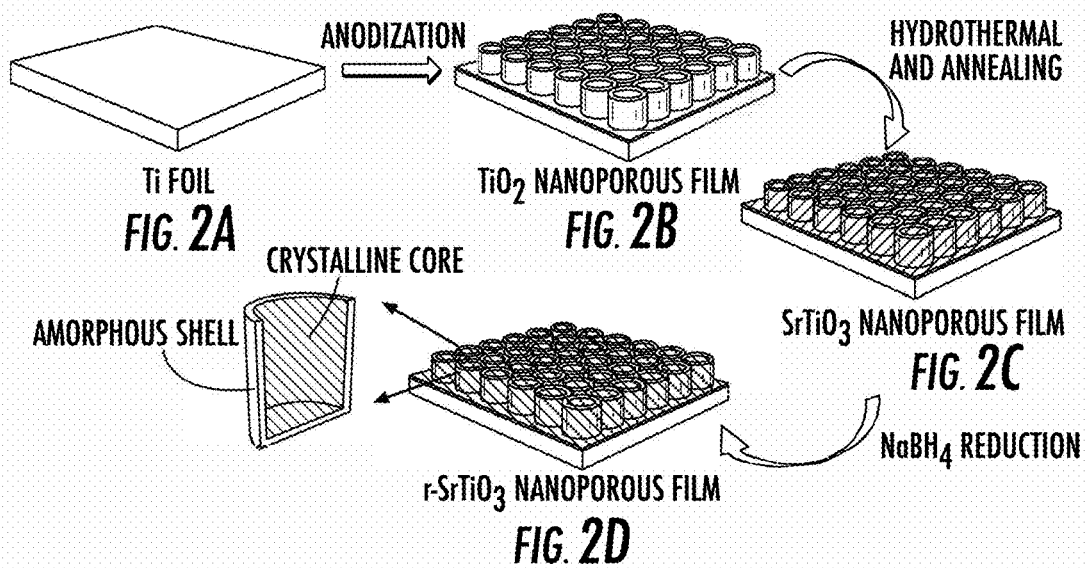
FIGS. 2A-D depicts the in-process structures corresponding to steps for forming an example heterostructured catalyst where the titania nanocavities are converted to $SrTiO_3$ nanocavities, where the surface of the $SrTiO_3$ is then reduced.

An example synthetic procedure for a plasmonic r-$SrTiO_3$ photoelectrode begins in FIG. 2A that shows a Ti foil. A highly ordered $TiO_2$ nanoporous film is first obtained by Ti anodization to form a $TiO_2$ nanoporous film with the results shown in FIG. 2B. Example anodization process parameters are described in the Examples section below. A SEM image obtained revealed that the as-obtained $TiO_2$ nanoporous film shows a honeycomb-shaped morphology with a nanopore size of about 60 nm and film thickness of 120 nm. Then the as-obtained $TiO_2$ nanoporous film was hydrothermally converted into a $SrTiO_3$ nanoporous film followed by an annealing treatment with the result shown in FIG. 2C. This 120 nm thick $TiO_2$ nanoporous film was chosen because it can be completely converted to $SrTiO_3$ without destroying the porous structure. The obtained $SrTiO_3$ film shows a highly porous structure, which is very similar to the annealed $TiO_2$ nanoporous film.

However, the nanocavity wall of $SrTiO_3$ (~20 nm) generally becomes thicker as compared with the $TiO_2$ nanoporous film (~10 nm) due to the phase transition and lattice expansion. Finally, the plasmonic r-$SrTiO_3$ nanoporous film was obtained by reducing the obtained $SrTiO_3$ nanoporous film with $NaBH_4$ in a $N_2$ atmosphere, with the result shown in FIG. 2D. r-$SrTiO_3$ on the surface of $SrTiO_3$ provides a heterostructure that is needed to generate the plasmonic effect. The r-$SrTiO_3$ nanoporous film shows almost the same morphology as the $SrTiO_3$ nanoporous film. an EDS analysis indicated that only Ti, O, and Sr elements are detected from the r-$SrTiO_3$ nanoporous film. TEM of the r-$SrTiO_3$ nanoporous film showed a honeycomb-shaped morphology, which is consistent with the SEM. The high-angle annular-dark-field (HAADF) scanning transmission electron microscopy (STEM) image and the corresponding elemental mapping of r-$SrTiO_3$ show a uniform distribution of Ti, Sr, and O, further confirming the formation of $SrTiO_3$.

Figure 6A:
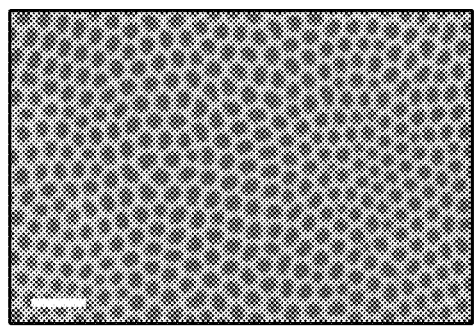
FIGS. 6A-G include FIG. 6A and FIG. 6B which are scanned SEM images of $TiO_2$ and r-$SrTiO_3$, respectively.
Figure 6B:
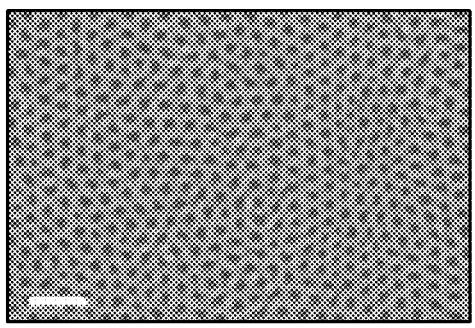
Figure 6C:
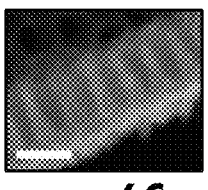
Figure 6D:
Figure 6E:
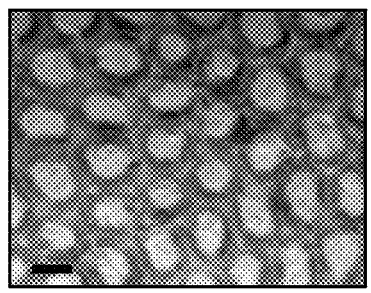
Figure 6F:
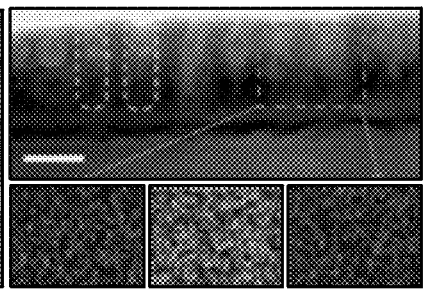
Figure 6G:
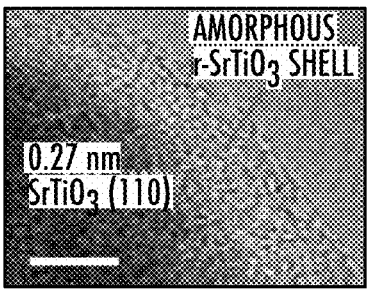

FIGS. 6A-G include 6A and FIG. 6B are scanned SEM images of $TiO2$ and r-$SrTiO3$, respectively. FIGS. 6C and 6D are cross-sectional scanned SEM images of $TiO2$ and r-$SrTiO3$, respectively. FIG. 6E is a scanned TEM image of r-$SrTiO3$. FIG. 6F is a scanned STEM image and corresponding elemental mapping of r-$SrTiO3$ (left to right: Ti, Sr, O). The dashed parts in 6G) indicate nanocavities. FIG. 6G is a scanned HRTEM image of r-$SrTiO3$. The Scale bars in 6a and 6B are 200 nm, and in 6C, D, and F 100 nm, FIG. 6E 50 nm, and in FIG. 6G the scale bars are 5 nm.

A high-resolution TEM (HRTEM) of r-$SrTiO_3$ shown in FIG. 6G evidences that an amorphous layer that is 4 nm thick which is apparently formed on the surface. Moreover, the core of r-$SrTiO_3$ is still highly crystalline with a measured lattice spacing of 0.27 nm, which is consistent with the cubic $SrTiO_3$ (110) plane. The HRTEM obtained confirmed that the r-$SrTiO3$ nanoporous film has a crystalline-core@amorphous-shell structure. During the preparation of r-$SrTiO_3$, $NaBH_4$ was used as an efficient oxygen scavenger by thermally decomposing and generating active hydrogen. The active hydrogen has a strong reductive capability, which can react with the oxygen atoms on the surface of $SrTiO_3$, thus producing a disordered (oxygen vacancies) surface layer. As a comparison, the pristine $SrTiO_3$ without reducing treatment is highly crystallized, as observed from the clear lattice feature displayed in a HRTEM image obtained.

The crystalline phases of the materials were recorded by X-ray diffraction (XRD). In contrast to the previous reports, which usually contained incompletely converted $TiO_2$ via the similar hydrothermal method by using micrometer-sized $TiO_2$ nanotubes/nanorods as precursors, the obtained $SrTiO_3$ nanoporous film showed excellent phase purity, indicating a complete phase conversion. The properties of the $TiO_2$ film, such as porous structure, ultrathin cavity wall (~10 nm), and thin film thickness (~120 nm), are beneficial for the complete conversion to $SrTiO_3$. The diffraction peaks are ascribed to metallic Ti and cubic $SrTiO_3$ phase and no XRD peaks of $TiO_2$ or other composition were found.

The purity of the $SrTiO_3$ nanoporous film was further confirmed by Raman spectra. The $SrTiO_3$ demonstrated two main regions of Raman peaks at 250-400 and 600-750 cm, which are in line with the standard Raman spectrum of $SrTiO_3$ As for the r-$SrTiO_3$, the XRD peaks and Raman peaks exhibit slight broadening and intensity decreasing compared with the pristine SrTiO3, which are due to the existence of oxygen vacancies. In contrast, direct annealing of the $TiO_2$ nanoporous film at 450° C. only leads to the production of crystalline $TiO_2$, which is revealed by the XRD and Raman spectra.

Figure 7A:
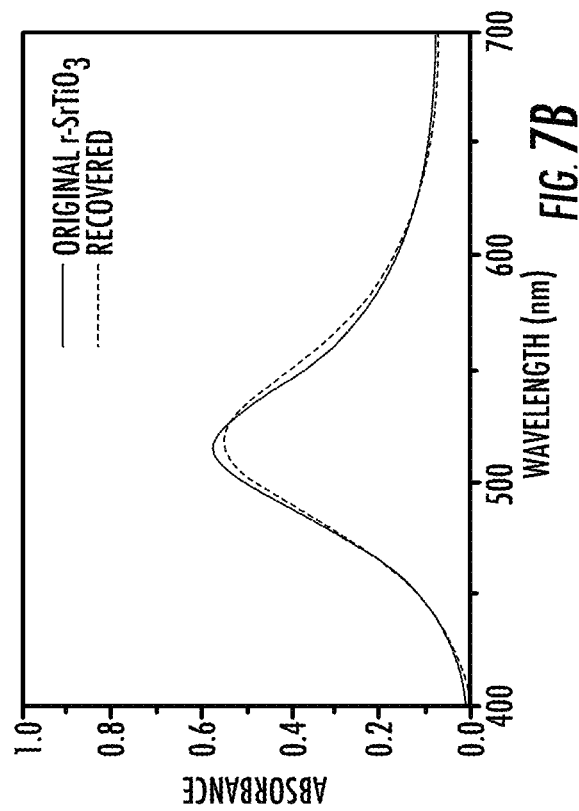
FIGS. 7A-D include FIG. 7A comprising a visible light absorption spectra of r-$SrTiO_3$ after exposure to oxidation in air at 400° C. over time in ambient conditions.
Figure 7B:
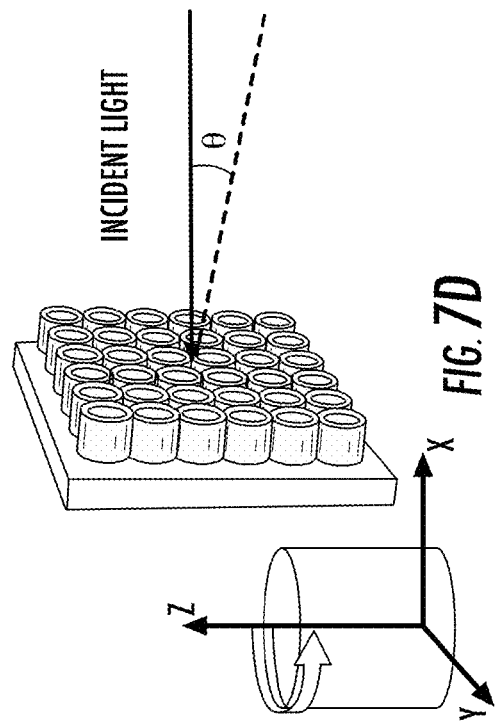
Figure 7C:
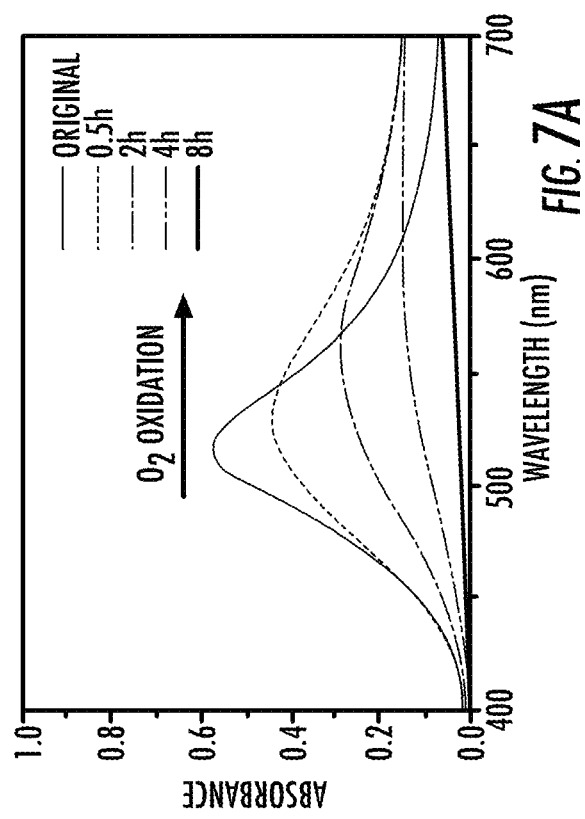
Figure 7D:
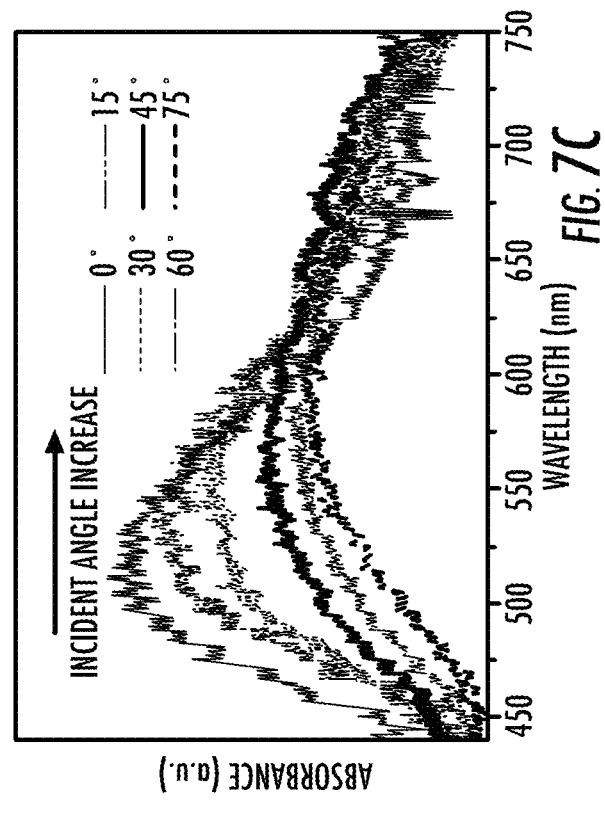

FIGS. 7A-D include FIG. 7A comprising a visible light absorption spectra of r-SrTiO3 after exposure to oxidation in air at 400° C. over time in ambient conditions. FIG. 7B is a visible light absorption spectra of the original r-SrTiO3 and recovered r-SrTiO3. The recovered r-SrTiO3 was obtained by NaBH4 reduction of the oxidized r-SrTiO3. 7C shows incident angle-dependent light absorption spectra of r-SrTiO3. FIG. 7D is a schematic illustration of the incident angle-dependent light absorption measurement.

Figure 8A:
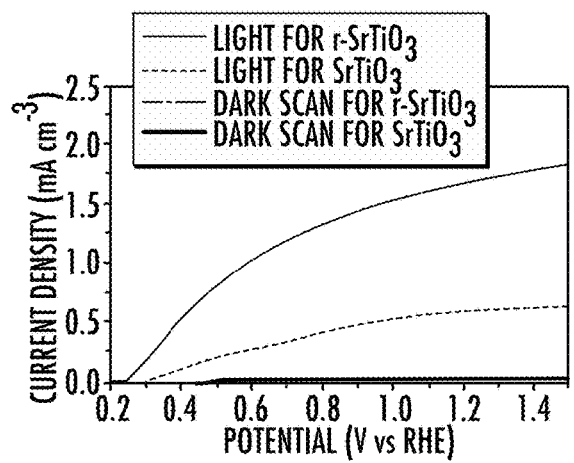
FIGS. 8A-E include FIG. 8A being a linear sweeps voltammogram (LSV) of $SrTiO_3$ and r-SrTiO3 photoelectrodes.
Figure 8B:
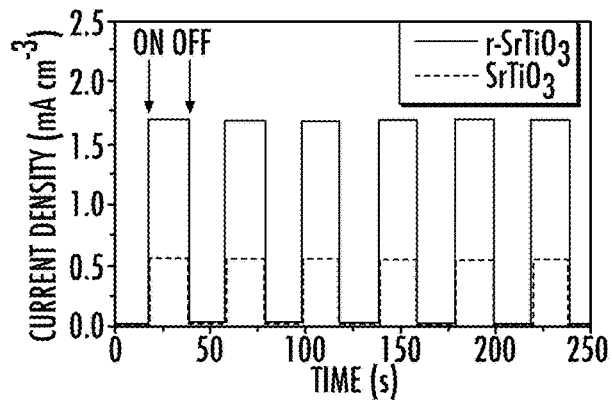
Figure 8C:
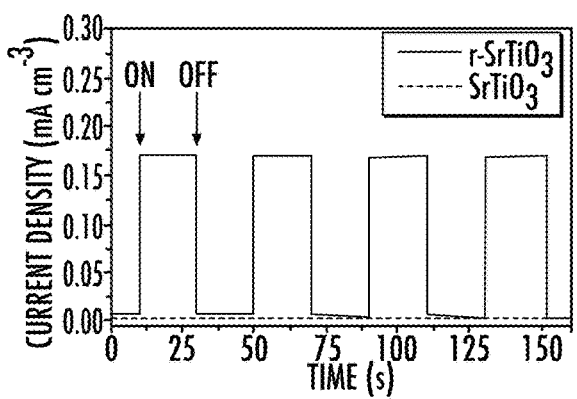
Figure 8D:
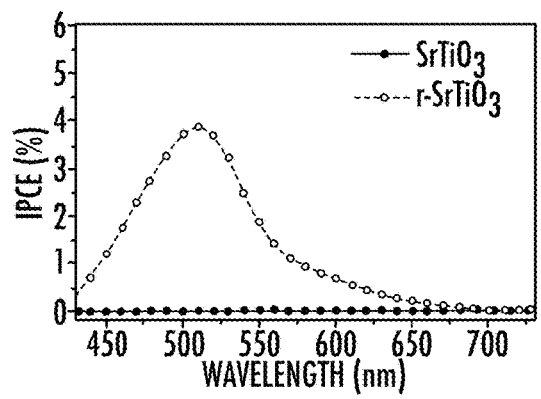
Figure 8E:
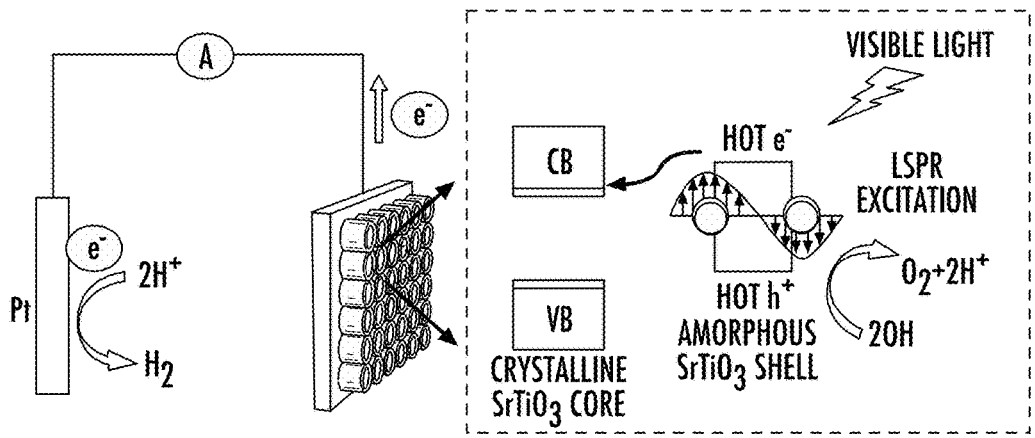

FIGS. 8A-E include FIG. 8A being a linear sweeps voltammogram (LSV) of $SrTiO_3$ and r-$SrTiO_3$ photoelectrodes. FIGS. 8B, and C are transient photocurrent responses of $SrTiO_3$ and r-$SrTiO_3$ photoelectrodes at 1.23 V vs. RHE under AM 1.5G illumination without and with a L-42 cutoff filter (λ≥420 nm), re-spectively. FIG. 8D shows IPCE spectra in the region of 430-730 nm at 1.23 V vs. RHE. FIG. 8E is a schematic illustration of a disclosed mechanism of r-$SrTiO_3$ for PEC water splitting under visible light.

A disclosed aspect with a metal or metal alloy on the nanocavities is now described as being aluminium. Among the earth abundant non-noble metals, Al has been reported as an economic plasmonic alternative to noble ones. Aluminum allows tuning the LSPR energy from the deep ultraviolet to the infrared region by changing the particle size. As a consequence, compared with noble metal-based plasmonic materials, Al-based plasmonic nanostructure should be considered for a plasmonic photoelectrode in the scalable application of PEC water splitting. However, due to the poor dewetting property of the aluminum and the naturally formed alumina ($Al_2O_3$) layer, the traditional dielectric substrates with a flat or disordered surface such as Si wafer and compact dielectric films, greatly hinder the formation of periodically ordered Al NPs for PEC applications. In addition, the formation and utilization of plasmonic Al@$TiO_2$ nanocavity arrays (NCAs) with a highly ordered morphology is not yet well examined.

Al@$TiO_2$ plasmonic heterostructure can be realized depositing the isolated Al NPs into the $TiO_2$ NCAs as a photoanode for PEC water splitting. In order to examine the formation of Al/$TiO_2$ NCAs and their corresponding solar absorption and charge transfer kinetics, different thickness (10 nm, 20 nm, and 30 nm) of Al film were deposited onto the $TiO_2$ NCAs followed by thermal dewetting treatment. The achieved photocurrent of Al@$TiO_2$ is much higher than that of the bare $TiO_2$ NCAs. The significantly enhanced PEC performance of Al@$TiO_2$ was attributed to the preferable plasmonic heterostructure with predominant hot carrier transfer and efficient utilization of solar light.

Figures 3A, 3B, 3C, 3D:
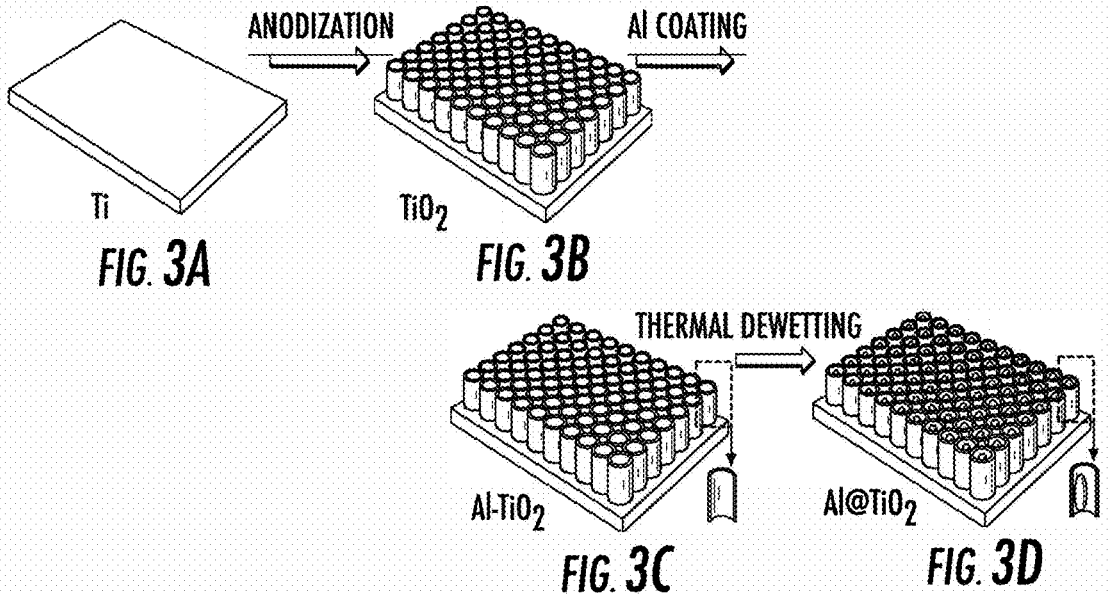
FIGS. 3A-D depicts the in-process structures corresponding to steps for forming an example heterostructured catalyst comprising forming a 2D array of titania nanocavities that are all directly attached to a substrate, where the metal layer or a metal compound layer on the titania nanocavities is described as comprising aluminum as an example metal.

The synthesis procedure of Al@$TiO_2$ is demonstrated beginning on FIG. 3A with a Ti foil. Firstly, anodization treatment is used to form highly ordered $TiO_2$ NCAs with porous nanostructure as shown in FIG. 3B with a nanopore size of 50 nm and a nanowall thickness of 8 nm. Then, $TiO_2$ NCAs were deposited with Al thin layers with different thickness (10 nm, 20 nm, and 30 nm) by e-beam evaporation with the result shown in FIG. 3C. Eventually, the isolated Al NPs were deposited into the $TiO_2$ NCAs by a thermal dewetting treatment in a nitrogen atmosphere with a schematic image of the Al@TiO2 nancavities shown in FIG. 3D, which was then directly used as photoanodes without further treatment for PEC water splitting.

FIGS. 9A-F include FIG. 9A and FIG. 9B showing SEM and TEM images of Al20@TiO$_2$. FIG. 9C is a HRTEM image of Al20@TiO$_2$. FIG. 9D is a cross sectional STEM image of Al20@TiO$_2$ (inset shows the linear EDS profile captured from the dashed line. The Al NPs are highlighted by white dashed circles). FIG. 9E is a STEM image and the corresponding EDS mapping of Al20@TiO$_2$.

Figure 10A:
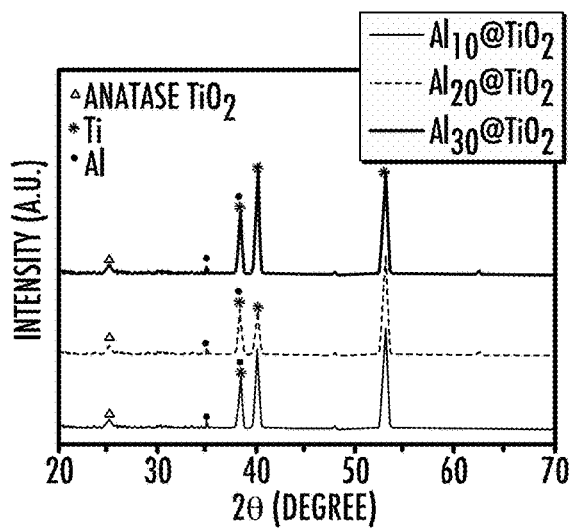
FIGS. 10A-F include FIG. 10A, and FIG. 10B comprising an XRD and XPS of $Al10@TiO_2$, $Al20@TiO_2$, and 30 nm thick aluminum on $TiO_2$ nanocavities represented as $Al30@TiO_2$.
Figure 10B:
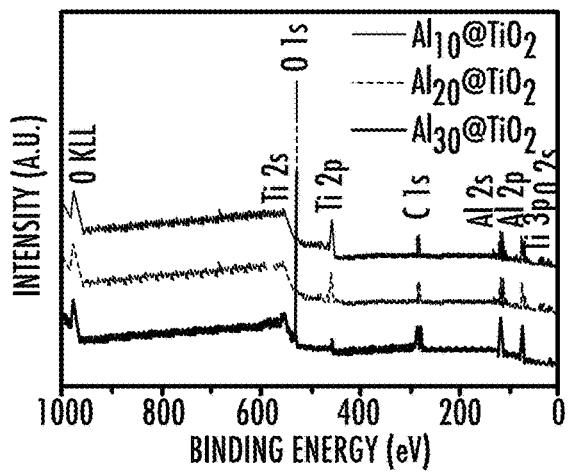
Figure 10C:
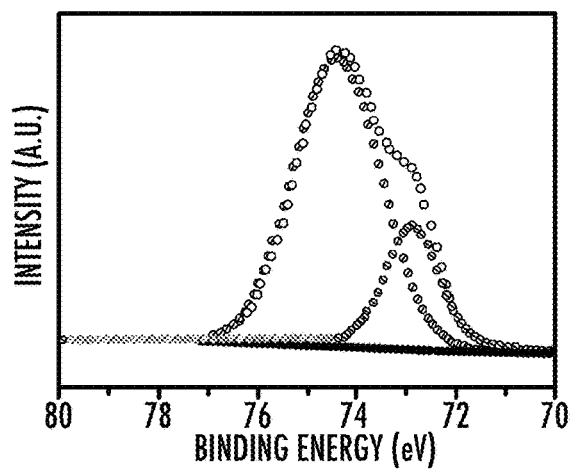
Figure 10D:
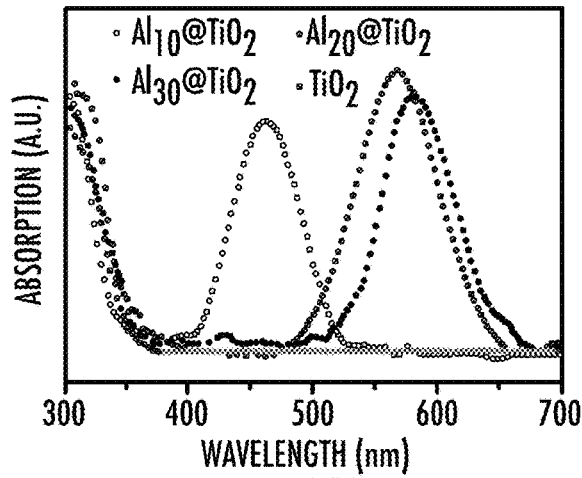
Figure 10E:
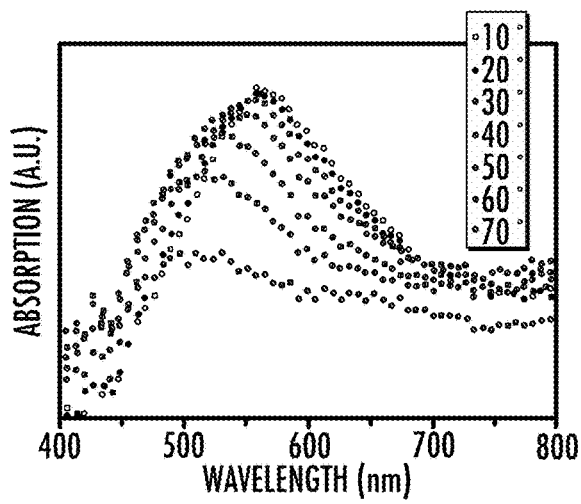
Figure 10F:
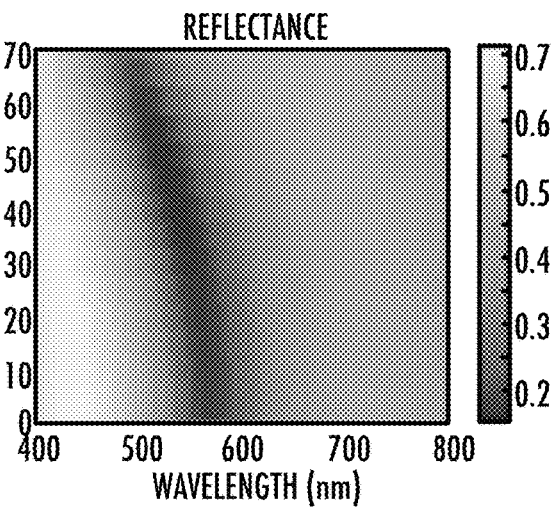

FIGS. 10A-F include FIG. 10A, and FIG. 10B comprising XRD and XPS of Al10@TiO$_2$, Al20@TiO$_2$, and Al30@TiO$_2$, which as described above mean 10, 20, and 30 nm thick aluminum on TiO$_2$ nanocavities. FIG. 10C is a high-resolution XPS of Al in the Al20@TiO2. 10D is a UV-vis absorption spectra of TiO2, Al10@TiO$_2$, Al20@TiO$_2$, and Al30@TiO$_2$. 10E is an incident angle-dependent light absorption spectra of Al20@TiO$_2$. FIG. 10F is a FDTD simulation of Al20@TiO$_2$ as a function of incident angle.

Figure 11A:
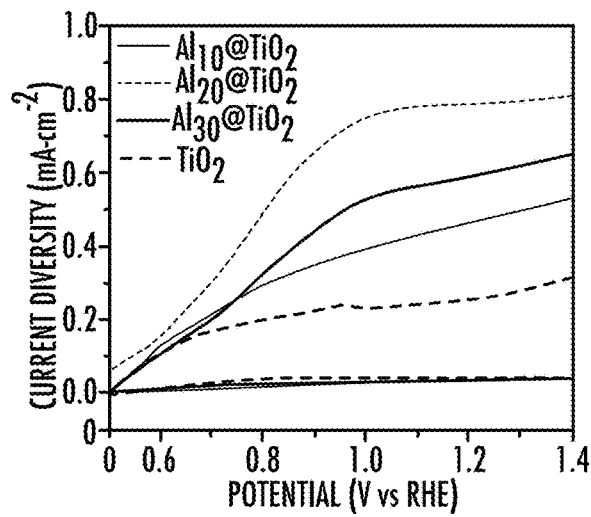
FIGS. 11A-F include FIG. 11A comprising a linear sweep voltammograms of TiO2, $Al10@TiO_2$, $Al20@Ti_O2$, and $Al30@TiO2$. Transient photocurrent responses of $TiO_2$, $Al10@TiO_2$, $Al20@TiO_2$, and $Al30@TiO_2$ NCAs at 1.23 V vs. RHE under UV-visible in FIG. 11B and visible light illumination in FIG. 11C, respectively.
Figure 11B:
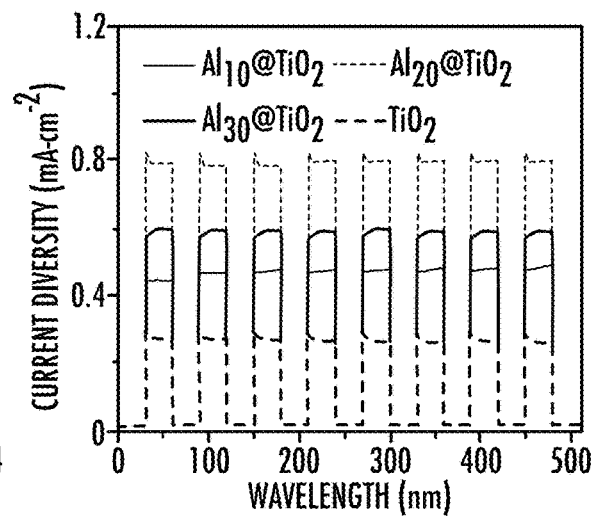
Figure 11C:
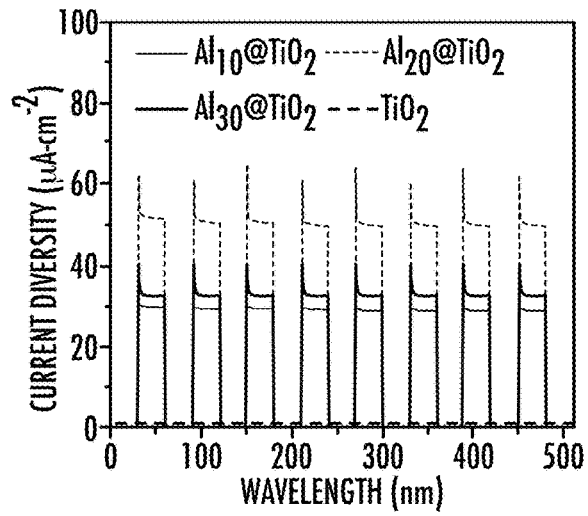
Figure 11D:
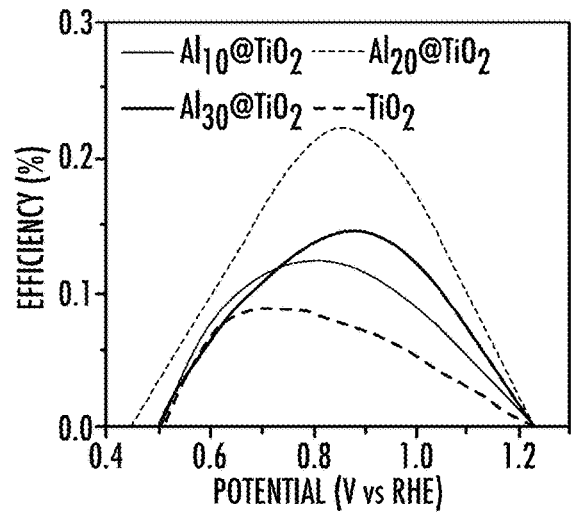
Figure 11E:
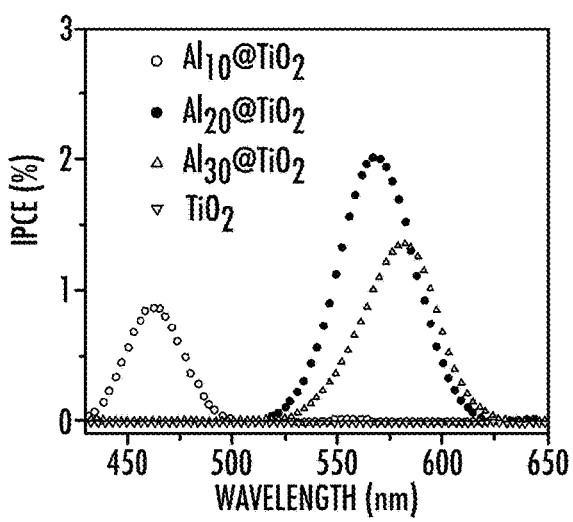
Figure 11F:
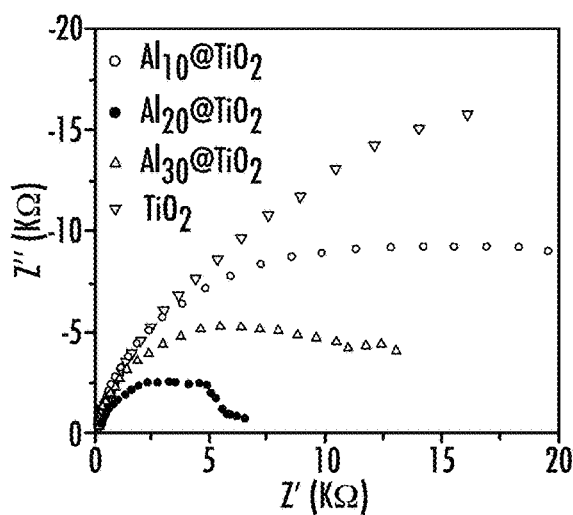

FIGS. 11A-F include FIG. 11A comprising a linear sweep voltammograms of TiO$_2$, Al10@TiO$_2$, Al20@TiO$_2$, and Al30@TiO$_2$. Transient photocurrent responses of TiO2, Al10@TiO$_2$, Al20@TiO$_2$, and Al30@TiO$_2$ NCAs at 1.23 V vs. RHE under UV-visible in FIG. 11B and visible light illumination in FIG. 11C, respectively. FIG. 11D shows the photoconversion efficiency as a function of external potential. FIGS. 11E, and 11F show IPCE and electrochemical impedance spectroscopy of TiO2, Al10@TiO$_2$, Al20@TiO$_2$, and Al30@TiO$_2$. SEM and transmission electron microscopy (TEM) were employed to investigate the influence of the deposited Al film thickness on the thermal dewetting kinetics of Al onto the nanostructured TiO$_2$ NCAs. The Al$_{10}$@TiO$_2$ NCAs (10 nm Al layer) showed that the average diameter of Al NPs inside the pores of TiO$_2$ NCAs was 25 nm and meanwhile a "crown" nanostructure was formed at the edges of TiO$_2$ NCAs wall as a result of the fewer nucleation centers created by 10 nm Al layer. With the increase of the Al layer thickness up to 20 nm (Al$_{20}$@TiO$_2$), the periodically ordered Al NPs with the diameter of 34 nm were uniformly isolated inside each pore of TiO$_2$ NCAs.

However, further increasing the Al layer thickness to 30 nm (Al$_{30}$@TiO$_2$) will generate the over-grown Al NPs with the size of 42 nm inside of the TiO$_2$ NCAs. At the same time, larger Al NPs with the size of 70 nm were aggregated and nonuniformly coated on the surface of TiO$_2$ NCAs indicating the saturation of Al NPs loading. The over-grown Al NPs on the TiO$_2$ NCAs would reduce the light-receiving area of TiO$_2$ NCAs and block the open pores of TiO$_2$ NCAs, leading to a negative adverse effect on the PEC performance. High-resolution TEM (HRTEM) and scanning transmission electron microscopy (STEM) images further confirmed the formation of the heterostructured Al$_{20}$@TiO$_2$. The lattice fringe spacings of 0.23 nm and 0.35 nm correspond to the (111) plane of Al and (101) plane of anatase TiO$_2$, respectively.

Moreover, an amorphous Al$_2$O$_3$ ultra-thin layer (1.5 nm thick) was conformally/naturally formed on the surface of Al NPs, which played a positive role in preventing Al NPs from chemical corrosion, contributing to a reduced recombination rate and eventually facilitating performance of PEC water splitting. The cross-sectional TEM view and linear energy dispersive spectroscopy (EDS) profile obtained showed that the highly discrete Al NPs were formed inside the TiO$_2$ NCAs. TEM-EDS mapping showed the distribution of Ti, O, and Al, indicating that each Al NP were solely isolated in the individual pore of TiO$_2$ NCAs.

The crystal structures of Al@TiO$_2$ NCAs were characterized by X-ray diffraction measurements. The main diffraction peaks located at 35.06°, 38.43°, 40.23°, and 53.04° correspond to Ti substrate. The characteristic peak at 25.3° is ascribed to the (101) crystal plane of anatase TiO$_2$. However, the characteristic peaks ascribed to Al is invisible in XRD patterns due to the ultra-low content of Al, which is overlapped the by Ti peak at 38°. X-ray photoelectron spectroscopy was employed to investigate the chemical composition of Al@TiO$_2$ NCAs, revealing the existence of Ti, O, and Al. High-resolution XPS spectra of Ti 2p revealed that two peaks at 459.20 eV and 464.97 eV were ascribed to Ti $2p_{3/2}$ and Ti $2p_{1/2}$ in TiO$_2$. Basically, an ultra-thin Al$_2$O$_3$ layer would be naturally formed on the surface of Al NPs right after exposure to air. Therefore, Al 2p peaks were resolved into two peaks at 74.40 eV and 72.84 eV, which were attributed to Al $2p_{3/2}$ in Al$_2$O$_3$ and metallic Al, respectively.

The Al/Al$_2$O$_3$ ratio was estimated from the high-resolution XPS spectra of Al 2p, revealing that Al$_{30}$@TiO$_2$ was of the lowest Al$_2$O$_3$ content because of the less oxidation activity of Al NPs with larger diameter compared with that of Al$_{10}$@TiO$_2$ and Al$_{20}$@TiO$_2$. This result is strongly supported by the Cabrera-Mott model that proves smaller particles are much easier to be oxidized. On the other hand, as indicated by HRTEM, the thickness of the amorphous Al$_2$O$_3$ ultra-thin layer was approximately 2.5 nm (Al$_{10}$@TiO$_2$), 1.5 nm (Al$_{20}$@TiO$_2$), and 0.8 nm (Al$_{30}$@TiO$_2$). Note that suitable thickness of Al$_2$O$_3$ will not only protect Al NPs from further oxidation but also prevent charge recombination and eliminate the Forster energy transfer. However, if the Al$_2$O$_3$ layer is thicker than the electron tunneling limit, it will generally be adverse to interfacial charge transfer. Eventually, a thicker Al$_2$O$_3$ layer of Al$_{10}$@TiO$_2$ will show inferior PEC performance compared with Al$_{20}$@TiO$_2$ and Al$_{30}$@TiO$_2$.

In order to investigate the optical properties of Al@TiO$_2$ NCAs, the UV-visible absorption spectra were examined. The optical absorption of TiO$_2$ NCAs decreased significantly at a wavelength of 380 nm, owing to the intrinsic light absorption of anatase TiO$_2$. In addition, plasmonic absorption peak centered at 462 nm, 560 nm, and 579 nm were observed in Al$_{10}$@TiO$_2$, Al$_{20}$@TiO$_2$, and Al$_{30}$@TiO$_2$, respectively, due to the LSPR effect and electromagnetic field polarization in Al@TiO$_2$ NCAs. On the other hand, it is noteworthy that Al$_{20}$@TiO$_2$ possesses the strongest intensity of the plasmonic absorption peak which is attributed to the optimal plasmonic heterostructure with a narrow size distribution of Al NPs inside TiO$_2$ NCAs without any interference from smaller Al NPs at the tubular edge of TiO$_2$ NCAs. Consequently, the unique optical property of Al$_{20}$@TiO$_2$ plasmonic heterostructure may contribute to preeminent catalytic performance for PEC water splitting. Furthermore, the incident angle-resolved plasmonic properties of Al$_{20}$@TiO$_2$ was also investigated. The Al$_{20}$@TiO$_2$ sample was rotated along the out-of-plane direction to change the incident angle from 10° to 70° at an interval of 10°.

As the incident angle increased, the plasmonic absorption peaks showed a blue shift (to lower wavelength) which was able to return backward with the decreases of incident angle. The similar phenomena were observed in the Al$_{10}$@TiO$_2$ and Al$_{30}$@TiO$_2$ NCAs as well. This dynamic shift resulting from the incident angle dependence was further confirmed by the FDTD simulation, showing that an approximately 60 nm blue shift occurred with incident angle increasing from 10° to 70°. It revealed that the orientation of Al NPs inside TiO$_2$ NCAs was very sensitive to the plasmonic resonance frequency mode induced by angle-resolved incident light and it had a significant impact on the distribution of carrier concentration inside the plasmonic catalyst.

Surface-enhanced Raman scattering (SERS) and angle-resolved SERS were further employed to examine the localized electromagnetic field enhancement surrounding the Al NPs inside TiO$_2$ NCAs. Rhodamine B (RhB) with the concentration of 10$^{-6}$ M was probed with the excitation wavelength of 785 nm for Raman measurements. All the Al@TiO$_2$ NCAs showed characteristic Raman peaks of RhB, namely, the characteristic peaks at 1125 cm$^{-1}$ and 1194 cm$^{-1}$, belonging to aromatic C—H bending. The other four peaks located at 1364 cm$^{-1}$, 1507 cm$^{-1}$, 1534 cm$^{-1}$ and 1564 cm$^{-1}$ were attributed to achromatic C—C stretching. According to the electromagnetic enhancement theory, the high SERS intensity of the Al@TiO$_2$ NCAs can be ascribed to their strong LSPR effect. However, no obvious Raman peaks could be found in the bare TiO$_2$ NCAs, indicating the strong plasmonic effect of Al NPs in the Al@TiO$_2$ NCAs. Furthermore, compared with Al$_{10}$@TiO$_2$ and Al$_{30}$@TiO$_2$, Al$_{20}$@TiO$_2$ showed the strongest SERS enhancement, revealing the strongest electromagnetic field enhancement in the rationalized Al$_{20}$@TiO$_2$ NCAs. Moreover, angle-resolved SERS measurement on the Al$_{20}$@TiO$_2$ NCAs was performed by mapping the SERS signal at the different incident laser angles. Because the dispersion of plasmonic energies changes with incident angle, the SERS enhancement varies consistently with the detection angles Specifically, the SERS performance decreases with the increased incident angle, which agrees well with the discussion on the incident angle-resolved plasmonic properties.

3D FDTD simulations were carried out to reveal the distribution of LSPR-induced electromagnetic field in the Al$_{20}$@TiO$_2$ plasmonic heterostructure and its contribution to PEC water splitting. The simulation model of the heterostructure was built upon the TEM, where the Al NPs loaded onto the tubular wall of TiO$_2$ NCAs. The excitation wavelengths of 380 nm and 567 nm were used in FDTD simulation. The FDTD suggests that the localized electromagnetic field is greatly enhanced at an incident light of 567 nm due to the LSPR absorption. Meanwhile, plasmonic hot spot region is formed near the edge of Al NPs (x-z plane) and the Al/TiO$_2$ interface (x-y plane), which confirms an enhancement of PEC activity under visible light. Specifically, hot electrons will transfer to the conduction band of TiO$_2$, leaving energetic holes on the Al NPs for water oxidation under light illumination. By contrast, the slight increase in the electromagnetic field excited by the UV light was observed, which played an equally crucial role in the enhanced PEC performance due to the synergism between the increased electromagnetic field in the UV region and the TiO$_2$ absorption.

The PEC performance of Al@TiO$_2$ and bare TiO$_2$ NCAs were measured in a standard three-electrode system in 0.5 M Na$_2$SO$_4$ aqueous electrolyte. Linear sweep voltammograms (LSV) of Al@TiO$_2$ and bare TiO$_2$ NCAs were tested in dark and light illumination. Almost no current was detected in the dark. When switched to light illumination, the remarkable photocurrent was displayed on the Al@TiO$_2$ NCAs. Note that, Al@TiO$_2$ NCAs showed substantially larger photocurrent than that of bare TiO$_2$ NCAs, which is almost 2 to 3 times the photocurrent of the bare TiO$_2$ at 1.23 V vs. RHE. This result proved that Al NPs played a favorable role in improving the PEC performance of TiO$_2$ upon illumination.

Among all of the Al@TiO$_2$ NCAs, Al$_{20}$@TiO$_2$ exhibited the highest photocurrent compared with Al$_{10}$@TiO$_2$ and Al$_{30}$@TiO$_2$. It suggests that critical size and loading amount of Al NPs, as well as the thickness of the surface Al$_2$O$_3$ ultra-thin layer, play significant roles in PEC water oxidation reaction. Confirmed by photoabsorption spectra and SERS analysis, with the increase of Al loading amount (from 10 to 20 nm), Al NPs were uniformly distributed inside TiO$_2$ NCAs and thus the number of hot electrons increased, which was favorable for PEC reactions. However, when the Al loading amount increased to 30 nm, particularly Al NPs were aggregated on the surface of TiO$_2$ NCAs which reduced the light-receiving area (shading effect) and thus affected adversely the PEC performance. On the other hand, the Al$_2$O$_3$ passivation layer is also critical to the improvement of PEC activity. The Al$_2$O$_3$ passivation layer with a proper thickness contributes to preventing Al NPs from corrosion and reduces the surface charge recombination. However, if it exceeds the thickness limit for charge tunneling, for example, Al$_{10}$@TiO$_2$, charge transfer will be blocked to across the photoelectrode/electrolyte interface. Thus, as a result of the insufficient loading amount of Al NPs and thicker Al$_2$O$_3$ layer, Al$_{10}$@TiO$_2$ showed inferior PEC activity compared with Al$_{20}$@TiO$_2$ and Al$_{30}$@TiO$_2$ NCAs.

The chronoamperometric I-t curves were measured to examine the instant photoresponse of Al@TiO$_2$ and bare TiO$_2$ NCAs under the potential of 1.23 V vs. RHE. The photocurrent of Al@TiO$_2$ sharply increases by 2-3 times greater than that of the bare TiO$_2$ NCAs under the UV-visible light which agrees well with the LSV curves, suggesting an efficient charge separation and stable photocurrent in the Al@TiO$_2$ NCAs. The longtime photocurrent measurement indicates that the Al$_{20}$@TiO$_2$ is stable in PEC water splitting reaction). After the longtime reaction, the Al$_{20}$@TiO$_2$ was collected and investigated by SEM, which showed no obvious change of morphology, further confirming the good stability of Al$_{20}$@TiO$_2$ for PEC water splitting. To further confirm the contribution from the plasmonic effect of Al NPs, I-t curves under visible-light illumination (AM 1.5 G combined with an L-42 cutoff filter, λ≥420 nm) were also recorded. No obvious photocurrent can be observed from the bare TiO$_2$ NCAs due to the large bandgap and insufficient excitation under visible light. Reproducible photocurrent can be obtained over Al@TiO$_2$, revealing an improved catalytic performance of TiO$_2$ NCAs after Al implantation under visible light, due to the LSPR effect. Consequently, the photoconversion efficiency (η) as a function of external potential was calculated by equation (1):

$$\eta = I(1.23 - V_{app})/P_{light} \quad (1)$$

where $V_{app}$ is the applied external potential vs. RHE; $P_{light}$ is the power density under illumination and I is the externally recorded photocurrent density. A greatly improved photoconversion efficiency of Al$_{20}$@TiO$_2$ was achieved compared with Al$_{10}$@TiO$_2$, Al$_{30}$@TiO$_2$, and bare TiO$_2$ NCAs.

Furthermore, incident-photon-to-current-conversion efficiency (IPCE) tests were performed to investigate the PEC activities of Al@TiO$_2$ and TiO$_2$ NCAs. Significantly, the shape of the IPCE curve in the visible region is similar to that of the LSPR absorption spectra. In addition, steeply increased transient photocurrent of Al@TiO$_2$ under visible light response is also consistent well with the IPCE of Al@TiO$_2$.

These results strongly validate that the LSPR of Al NPs contributes to PEC activity in visible light. On the other hand, it is worth mentioning that the IPCE data from photoanode of Al$_{20}$@TiO$_2$ indicates a higher photocurrent density compared with that of Al$_{10}$@TiO$_2$ and Al$_{30}$@TiO$_2$.

It is mainly due to the synergetic effect of reduced charge transfer resistance and longer lifetime of hot carriers within the optimized $Al_{20}@TiO_2$ photoanode. Herein, to have an insightful understanding of the charge transfer and lifetime, electrochemical impedance spectroscopy (EIS) and hot carrier lifetime ($\tau_n$) vs. open-circuit photovoltage ($V_{oc}$) were employed. The resistance of electrolyte-semiconductor interface ($R_2$) of $Al@TiO_2$ photoanode is lower than that of $TiO_2$ NCAs, indicating that the internal electromagnetic field built up at $Al/TiO_2$ interface leads to effective electron-hole separation and thus reduces the chance for charge recombination. $Al_2O_3$ as insulating layer will modify the distance between $TiO_2$ NACs and Al, and therefore eliminating the Forster energy transfer to reduce the recombination of charge carriers.

Moreover, the $Al_2O_3$ passivation layer formed on the surface of Al NPs can effectively prevent carriers from being captured by the surface states of $TiO_2$ NACs and significantly decrease the recombination. When compared with $Al_{10}@TiO_2$ and $Al_{30}@TiO_2$, $Al_{20}@TiO_2$ with a greatly reduced resistance makes a favorable condition for hole output from photoanode to the electrolyte, leading to much better performance for water oxidation. Additionally, the potential decay curves obtained via interruption of visible-light irradiation were measured to gain an insightful understanding of kinetical charge transfer for $Al@TiO_2$ NCAs. The $Al@TiO_2$ photoanodes were firstly irradiated with visible light for several seconds to induce the hot electrons transfer from Al NPs to $TiO_2$. When the light was interrupted, potential decayed until reaching to an equilibrium state because the hot electrons on $TiO_2$ would transfer back to the to Al NPs. The mean lifetime of hot electrons in the conduction band of $TiO_2$ can be calculated by equation (2):

$$\tau_n = -(k_B T/q)(dV_{oc}/dt)^{-1} \quad (2)$$

where $k_b$ is the Boltzmann constant, q is the elementary charge of the electron, $V_{oc}=E_{ph}-E_{dark}$. The $\tau_n$ of $Al_{20}@TiO_2$ is larger than that of $Al_{10}@TiO_2$ and $Al_{30}@TiO_2$ NCAs, revealing that greatly enhanced charge separation efficiency of hot carriers by suppressing the back electron transfer.

Based on above discussion, the electron-transfer mechanism of the plasmonic Al@TiO2 heterostructure for PEC water oxidation under visible light appears likely. When the photon energy matches the LSPR region of Al NPs inside the $TiO_2$ NCAs, it will excite the LSPR absorption. Then hot electron-hole pairs generated by the surface plasmon will be separated at $Al/TiO_2$ interface and transfer towards opposite direction. A large number of hot electrons will be dynamically injected into the conduction band of $TiO_2$. Meanwhile, the energetic holes on the Al NPs will be utilized for water oxidation. Therefore, the improved PEC activity of $Al@TiO_2$ NCAs in visible light is primarily attributed to the hot carriers produced by LSPR excitation of Al NPs.

Another disclosed aspect uses $MoS_2$ as the metal or metal compound coating on the nanocavities. $MoS_2$ belongs to the two-dimensional (2D) layered transition metal dichalcogenides (TMDs) family that has a sandwich-like structure of Mo atoms between two layers of hexagonally packed sulfur atoms. The weak Van der Waals bonding between these 2D layers can give rise to single- or few-layer nanosheet architectures. This aspect recognizes that $MoS_2$ can be a promising electrocatalyst for the hydrogen evolution reaction (HER), owing to the nanosized $MoS_2$ edge defects that are preferential to hydrogen adsorption, so that few-layered nanoscale $MoS_2$ flakes can serve to improve the efficiency of hydrogen evolution. Chemical exfoliation and solvothermal methods are conventionally used for the fabrication of nanostructured $MoS_2$. However, these methods usually promote irregular particle formation or undesirable stacking of multilayer $MoS_2$ deposit products. Multilayer stacking exposes more catalyst basal planes than edges, rendering much of the material catalytically inert. Additionally, without proper dispersion and immobilization, powdered nanomaterials can suffer from particle aggregation, leading to performance degradation. Until this Disclosure, an efficient scheme or design principle for the integration of ordered, nanostructured $MoS_2$ with wide band gap semiconducting behavior is believed to have eluded researchers.

Compared with metallic $1T-MoS_2$, $2H-MoS_2$ exhibits high stability and semiconducting properties at room temperature, allowing them to be used as a co-catalyst coupled with other wide band gap semiconductors for $H_2$ evolution in a photoelectron reactive medium. However, $MoS_2$ is not known as the main photocatalyst, especially those that attribute to NIR intrinsic absorbance. Theoretical calculations demonstrate that the band gap of $MoS_2$ can be modulated through control of particle size. In this case, the band gap broadens from 1.2 eV to 1.9 eV when the $MoS_2$ architecture changes from bulk to monolayer. This characteristic can be ascribed to the quantum confinement of nanomaterials. The energy band structure can also be affected by the metal-chalcogenide stoichiometric ratio. The nonstoichiometric metal-chalcogenides (e.g., $WO_{3-x}$, $Cu_{2-x}S$, and $MoO_{3-x}$) can display evidence of an indirect plasmonic absorption, which is distinctly different from previously reported band gap transitions. Therefore, LSPR can be used to describe the light harvest phenomena, which is mainly deduced from charge collective oscillation on the metal chalcogenide surface propagated by numerous anions (O or S) vacancies within the crystal lattice. The nonmetal $MoS_2$ with plasmonic absorption may be a solution to fill the visible light harvest gap vacated by wide band gap semiconductors, effectively improving the solar-to-energy efficiency of HER photocatalysts. Lastly, $MoS_2@TiO_2$ hybrid catalysts have been recently reported that aim to enhance photocatalytic efficiency by modulating the $TiO_2$ energy level with inter-band coupling. Disclosed $MoS_2@TiO_2$ heterostructures have unique feature including functioning as a thin-film catalyst, are highly ordered and well-controlled morphology, self-cleaning, and long lifespan as compared to known $MoS_2@TiO_2$ hybrid catalysts.

This aspect includes a combined physical vapor deposition (PVD) and chemical vapor deposition (CVD) process for coating few layered $MoS_2$ nanoflakes conformally on the inner surface of anodized $TiO_2$ nanocavity arrays (referred to as $MoS_2@TiO_2$) with a highly-ordered 3D hierarchical configuration. The stoichiometric ratio of Mo and S atoms within the $MoS_2$ lattice and vertically contacting facets of $MoS_2$ and $TiO_2$ can be controlled by tuning the S source concentration in a $Na_2S_x$ solution and altering the CVD reaction rate (see the below described experimental details). This highly localized growth enables conformal and uniform $MoS_2$ nanoflakes to be formed on the surface of $TiO_2$ nanocavities.

Disclosed heterostructures with $MoS_2$ have shown powerful photon harvesting abilities in the UV-Vis-NIR range by tethering the $TiO_2$ substrate to a plasmonic/intrinsic $MoS_2$ coating. The facilitated electron transfer pathway and appropriately tuned the energetic position of the conduction band results in facile charge carrier separation and dramatically enhanced $H_2$ evolution efficiency. UV-Vis spectroscopy analysis, finite element method simulation (FEM), and the monochromatic light irradiated $H_2$ generation rate evidence that LSPR, mainly excited in the wavelength from 400 nm to 600 nm, substantially contributes to photocatalytic activity. Minimal red and NIR light induced $H_2$ production is observed from the lower photoelectron energetic level of the $MoS_2$ inter-band excitation and excessive photoelectron-hole recombination. This nonmetal plasmonic heterostructure is also expected to be applicable to other 2D material systems, which can serve as a new design protocol for highly efficient photocatalysts.

Conventional photocatalysts can generally only absorb UV-vis light which occupies only less than 50% solar light spectrum. Disclosed $MoS_2/TiO_2$ catalysts can absorb solar energy in a much broader wavelength range compared to conventional photocatalysts, generally resulting at least two-fold higher energy conversion efficiency compared to conventional photocatalyst material uses including solar energy harvesting, photovoltaics, and clean fuels generation.

A broad spectral response was evidenced ranging from ultraviolet-visible (UV-Vis) to near-infrared (NIR) wavelengths and finite element frequency-domain simulation suggest that this $MoS_2$@$TiO_2$ heterostructured photocatalyst enhances activity for $H^+$ reduction. A high $H_2$ yield rate of 181 mol $h^{-1}$ $cm^{-2}$ (equal to 580 mmol $h^{-1}$ $g^{-1}$ based on the loading mass of $MoS_2$) is achieved using a low catalyst loading mass. The spatially uniform heterostructure, correlated to plasmon-resonance through conformal coating $MoS_2$ that effectively regulated charge transfer pathways, is proven to be vitally important for the unique solar energy harvesting and photocatalytic $H_2$ production.

EXAMPLES

Disclosed embodiments of the invention are further illustrated by the following specific Examples, which should not be construed as limiting the scope or content of this Disclosure in any way.

2.1 Material Preparation for the $MoS_2$ Embodiment:

The anodic growth of $TiO_2$ nanocavities comprised using titanium foils (25.4×25.4×0.05 mm thick, 99.7% purity, MTI Corporation) as the substrates that were ultrasonically cleaned in acetone, ethanol, and deionized (DI) water for 30 minutes and were then dried in air. The sample size was rationally chosen but not limited to 1-inch square by this fabrication method. Anodization was carried out in 3M $HF/H_3PO_4$ (98%, Alfa Aesar, US). A constant voltage of 10 V was applied to a two-electrode setup for 4 hr with a Pt foil as a counter electrode. After anodization, the $TiO_2$ films were rinsed with ethanol, then dried in air.

Mo deposition and sulfurization comprised using an e-Beam evaporator (Thermo Scientific) to deposit Mo layers into anodized $TiO_2$ films with a thickness of 10, 20, 30 nm, respectively. The Mo layer thickness was controlled by an automated quartz crystal film-thickness monitor. The as-prepared Mo@$TiO_2$ hybrid was then put in the center of a quartz-tube furnace (MTI Corporation) together with 0.5 M $Na_2S$ solution containing 1 M sulfur (placed in a crucible at the upstream side, at a temperature of 100° C., ramping speed of 2° C. $min^{-1}$). The $MoS_2$@$TiO_2$ heterostructure was fabricated at 400° C. for 10 min with a heating rate of 5° C. $min^{-1}$ under vacuum. The obtained $MoS_2$ mass loading was estimated by depositing Mo on compact Ti foils with the same e-beam rate and time mentioned above, the thickness of obtained Mo was confirmed by SEM and TEM. Loading of Mo was estimated by multiplying volume and density of Mo. Deposited Mo is supposed to be changed to $MoS_2$ (10.2, 20.4 and 30.6 μg $cm^{-2}$ for 10, 20, and 30 nm Mo deposits, respectively).

2.2 Material Characterization

Morphologies of $MoS_2$@$TiO_2$ films were observed with a field-emission scanning electron microscope (FE-SEM, ZEISS ultra 55) and a high-resolution transmission electron microscope (FEI Titan 80-300 STEM with probe Cs corrector and ETEM with imaging Cs corrector). The cross-section sample for TEM was cut off by a Tescan LYRA-3 Model GMH focused ion beam microscope and pasted onto Cu ring holder. X-ray diffraction (XRD) was obtained using a X'pert Powder (PANalytical, equipped with a Panalytical X'celerator detector using Cu Kα radiation, λ=1.54056 Å). The chemical composition was characterized by X-ray photoelectron spectroscopy (XPS, Physical Electronics 5400 ESCA). Raman spectra were measured using a Renishaw InVia Microscope Raman (532 nm laser excitation). Absorption spectra were obtained on a Cary Win UV-visible spectrometer from 300 to 700 nm. Incident angle (θ, the angle of excitation light to normal through the center of $TiO_2$ nanocavity) and excitation polarization angle (φ, excitation polarization around the normal through the center of $TiO_2$ nanocavity) dependent absorption spectra were tested by rotating the sample from 0-180° with an fixed incident angle or rolling over the sample from a vertical direction to a parallel one. A Fourier transform infrared spectroscope (spectrum 100 FT-IR spectrometer, PerkinElmer) was employed for testing absorbance in the infrared region. The photoluminescence spectra were collected by a NanoLog Spec fluorescence spectrometer excited by a helium-cadmium lamp at 400 nm.

Regarding XPS fitting, all spectra were analyzed with the Casa XPS software (version 2.3.15). The samples were conductive so the binding energies were not charge referenced. Shirley background subtraction was used for all spectra. Peak models for each photoelectron line were generated using nonlinear least-squares Gaussian/Lorentzian curve-fitting. The S 2p line was fitted with multiple sets of doublets and constrained to have the same FWHM within each pair as well as a 2:1 intensity ratio and 1.16 eV separation between the $2p_{3/2}$ and $2p_{1/2}$ peaks. Similarly, the Mo 3d line was fitted with multiple sets of doublets as well as a 3:2 intensity ratio and 3.3 eV separation between the $3d_{5/2}$ and $3d_{3/2}$ peaks.

2.3 Photocatalysis Characterization

Regarding photocatalytic $H_2$ evolution, $H_2$ production was performed in a sealed 20 ml quartz reactor. $MoS_2$@$TiO_2$ films with a size 7×7 mm were submerged in 15 ml of a mixed solution made of DI water (Sea water) and methanol (8:2 by volume). Subsequently, the reactor was illuminated by a solar light simulator (AM 1.5, 300 W Xe, 100 mW $cm^{-2}$) or monochromatic light (Zahner CIMPS-QEIPCE system with monochromator and light source from 350 to 800 nm). The gas produced from the upper space above the solution in quartz reactor was periodically analyzed.

2.4 Computational Method

Regarding finite Element Method Simulation (FEM), COMSOL MULTIPHYSICS (version 5.2) was used for the FEM solution. The 3D simulation model was designed as a simplified heterostructure, where three $MoS_2$ nanorods (diameter: 10 nm; length: 20 nm, parallel to the y-axis) standing vertically on $TiO_2$ (diameter: 50 nm; length: 70 nm, parallel to the z-axis). The incident laser wavelength was set from 300-700, with the polarization direction along the x-axis. The electric field distributions of hybrid nanocavity arrays were monitored across the middle of $TiO_2$ nanotube at x-z and y-z planes.

Regarding band structures calculation of $MoS_2$. First-principles calculation based on density functional theory (DFT) was used to estimate the electronic property of $MoS_2$ layer upon S-vacancy deviation (Vienna ab initio simulation program, VASP). The ion-electron interactions were depicted by projector-augmented wave method. The generalized gradient approximation (GGA) was adopted with Perdew-Burke-Ernzerhof (PBE) exchange-correlation function. 4×4 unit cells were employed as calculation model with S-vacancy of 0%, 8%, and 16% respectively. Band structure was relaxed by a 6×6×1 special k-point mesh grid with 880 eV energy cut off on plane-wave.

3. Results and Discussion 3.1 Morphology, Microstructure, and Component Analysis A typical fabrication route of a $MoS_2@TiO_2$ plasmonic heterostructure is schematically illustrated in FIG. 12A. Highly-ordered honeycomb-shaped $TiO_2$ nanocavities are obtained through Ti anodization (FIG. 12A, with an average pore size of 50 nm and a wall thickness of 10 nm). E-beam evaporation was performed to deposit 10, 20, and 30 nm of Mo onto the anodized $TiO_2$ nanocavity arrays. An obvious cavity wall thickening (increased from 10 nm to 20 nm) is found after Mo coating (FIG. 12B).

CVD sulfurization was carried out at 400° C. for 10 min on $TiO_2$ coated with different Mo thicknesses (abbreviated $MoS_{2(10)}@TiO_2$, $MoS_{2(20)}@TiO_2$, $MoS_{2(30)}@TiO_2$, respectively for 10 nm, 20 nm and 30 nm thick $MoS_2$, respectively). It was observed that pore size significantly shrunk after CVD treatment when the deposited Mo thickness increased from 10 to 20 and 30 nm (FIGS. 12B-D, FIG. 12C). Transmission electron microscopy (TEM) of $MoS_2@TiO_2$ nanocavity arrays shows that $MoS_2$ nanoflakes are grown inside $TiO_2$ nanocavities with a highly-ordered 3D laminate structure (FIGS. 12A-C). These $MoS_2$ nanoflakes typically consist of less than 10 layers, which were verified by Raman spectra. Part of the $MoS_2$ nanoflakes stand vertically on the $TiO_2$ surface or connect with $TiO_2$ nanocavity walls at a big intersection angle.

High-resolution TEM (HR-TEM) identified lattice fringes of 0.62 nm and 0.35 nm, corresponding to the (002) hexagonal facets of $MoS_2$ and the (101) facets of anatase $TiO_2$, respectively. It is also revealed that the $MoS_2$ nanoflakes are bound seamlessly to the $TiO_2$ nanocavity wall surfaces, indicating a perpendicular growth of $MoS_2$ nanoflakes on the $TiO_2$ surface where TEM images showed perpendicular growth of $MoS_2$. Spherical aberration corrected high angle annular-dark-field (HAADF) scanning transmission electron microscopy (STEM) and bright-field (BF) STEM were performed to clarify the atomic structure of $MoS_2$. The image contrast of BF-STEM exhibits a relationship with respect to atomic number (Z), therefore the sandwich structure of $MoS_2$ is clearly observed. In addition, the S-vacancies can be identified, as marked by blue dashed circles and blue arrows. Interestingly, it seems the S-vacancy exhibits local 'staging' structures, as seen for most S atoms throughout the structural layers.

Cross-sectional STEM images were obtained of $MoS_2@TiO_2$ heterojunctions, demonstrating that a fully filled $MoS_2$ laminated network inside the $TiO_2$ nanocavities was successfully fabricated. Energy dispersive X-ray spectrometry (EDS) mapping analysis showed the distribution of each element at interface of junction. The separation assignment of Ti to Mo and S further proves the isolated vertical connection of $MoS_2$ and $TiO_2$ at the heterojunction.

In a normal S steam based CVD process, Mo conversion takes place almost spontaneously upon S arriving at the metal surface, making it difficult to control the $MoS_2$ morphology. One method to allow more morphological control is to slow S evaporation using a liquid precursor containing $S_x^{2-}$ ions (see more details in experimental section) and combined with a low-temperature ramping rate (2° C. min$^{-1}$). The S source derived from the $Na_2S_x$ solution first arrives at the hollow $TiO_2$ nanocavities and then will transmit gradually along the cavity walls. As it is understood, the growth direction of $MoS_2$ nanoflakes is synchronous with S diffusion, from the middle of $TiO_2$ cavity to the edges. Eventually, a vertically laminated $MoS_2@TiO_2$ heterostructure was formed inside the $TiO_2$ cavities. A photograph of the $MoS_{2(10)}@TiO_2$ heterostructure provided in FIG. 12G shows uniform morphologies at different sample locations, indicating a highly uniform $MoS_2@TiO_2$ throughout the entire sample. Control experiments were carried out by using a normal solid S source, flat $TiO_2$ film or Mo foil in duplicate reactions. Larger $MoS_2$ flakes with disordered architecture were obtained for all control experiments (FIGS. 12D-F), further verifying the significant impact made by the addition of $TiO_2$ nanocavity arrays and using liquid S source toward the inhibited $MoS_2$ overgrowth that promotes the formation of a $MoS_2@TiO_2$ heterostructure configuration.

XRD patterns of as-prepared $MoS_2@TiO_2$ films were obtained. The main diffraction peaks are indexed to the Ti substrate (PDF file No. 44-1294) because of the thin thickness of the $TiO_2$ film and low $MoS_2$ content. Noticeably, a weak peak at 14.5°, corresponding to the c-plane (002) of $2H-MoS_2$ (S-Mo-S graphene-like layer, PDF file No. 86-2308), can be observed and intensifies with Mo thickening. Diffraction patterns of Ti substrates are a little different by the orientation diversity of commercial Ti foil, depending on the manufacturing process. Raman spectroscopy is more distinct for demonstrating the $MoS_2$ layered structure. Peaks around 378 and 402 cm$^{-1}$, corresponding to in-plane $E_{2g}$ and out-of-plane $A_{1g}$ vibration modes of $2H-MoS_2$ are dominant in the spectra. Red-shift of $E_{2g}$ and blue-shift of $A_{1g}$ occurs with increasing Mo thickness from 10 to 30 nm as well as prolonging sulfurization time from 10 to 50 min for the $MoS_{2(30)}@TiO_2$ film.

A frequency difference monotonically increased from 21.25 cm$^{-1}$ to 24.24 cm$^{-1}$, which is in excellent agreement with the literature report indicating a thickness of less than 10 stacking layers of $MoS_2$ per flake. The greater intensity ratio of $A_{1g}$ to $E_{2g}$ is due to a large amount of surface edge exposure and strong interlayer restoring force interactions acting on misalignments or defects in the $MoS_2$ layers. It is very clear that there is no Mo oxide can be found from both XRD and Raman, indicating a complete conversion from Mo to $MoS_2$ after CVD treatment. Experimental tests also indicate the effect of Mo oxide on the optical and photocatalytic properties can be ignored, which will be further discussed in the following sections.

Surface defects, chemical states and the stoichiometric ratio of Mo and S in the $MoS_2@TiO_2$ heterostructure were investigated by X-ray photoelectron spectroscopy (XPS) analysis. $2H-MoS_2$ and $TiO_2$ were confirmed by XPS results). The high-resolution S 2p spectrum demonstrates that there are three overlapping chemical states of S. The doublet centered at 161.7 eV is assigned to S 2p in a Mo-S configuration, the upshifted peaks at 163.4, 166.6 and 169.9 eV are due to the existence of S, Mo-O-S band or oxidized S on the surface of $MoS_2$. More oxidized S was found with an increase the amount of $MoS_2$. Binding energies for Mo $3d_{3/2}$, Mo $3d_{5/2}$ are fitted to a pair of doublets at 227.9/231.2 eV and 228.9/232.2 eV, respectively, which confirms the $Mo^{3+}$ and $Mo^{4+}$ accordingly. The existence of $Mo^{3+}$ ions implies the formation of S defects in $MoS_2$ and account for about 20-30% of the total Mo element semi-quantitatively estimated from the XPS spectral area in the $MoS_{2(10)}@TiO_2$ sample (S-vacancy is in a range of 5-8% percentage of S atoms deficiency). $Mo^{6+}$ ions can be slightly detected because of surface oxidation during in-air storage. Combining the aforementioned investigations, it can be concluded that the S-vacancy and nonstoichiometric features of $MoS_2$ nanoflakes are where free electrons and plasmonic resonance processes originate. The XPS spectral states of Ti and O are in agreement with crystalline $TiO_2$.

3.2 Spectral Response and Photocatalytic Performance

The solar light harvesting of $MoS_2@TiO_2$ heterostructure was investigated through UV-Vis absorption spectra with an incident angle of 0°. The intrinsic absorption edge located at about 360 nm belongs to the $TiO_2$ substrate, suggesting a band gap of 3.2 eV. Furthermore, very broad peaks ranging from 400 to 600 nm can be detected on the $MoS_2@TiO_2$ heterostructures. This visible light response is distinctly far from band gap excitation of both $MoS_2$ and $TiO_2$ portions, consistent with heterostructured films. Consequently, a metal-like LSPR is assigned to this absorbance, which arises from collective oscillations of excess charges (electrons) on the edge of $MoS_2$. Abundant S-vacancies and highly ordered vertically laminated structures may dominate the free charge interactions. It has been well recognized that the catalytic activities of both semiconducting $2H-MoS_2$ and metallic $1T-MoS_2$ generally arise from edge sites and S-vacancies. Both edges and S-vacancies are considered responsible for crystal asymmetry of the analyte, where the electronic structure is changed slightly. Electrons in a higher Fermi level are easy to transfer to local collected vacancies on the surface of $MoS_2$. When the orbital density vibration of these electrons resonant with incident light, photo-excited local dipoles and charge separation happens, forming a confined local field around $MoS_2$ surface. Thereby S-vacancies and surface "hot" electrons are applied to plasmonic antennas, which arises a modulation of the Fermi level and drastically change the initial electronic properties of $MoS_2$.

Figure 13A:
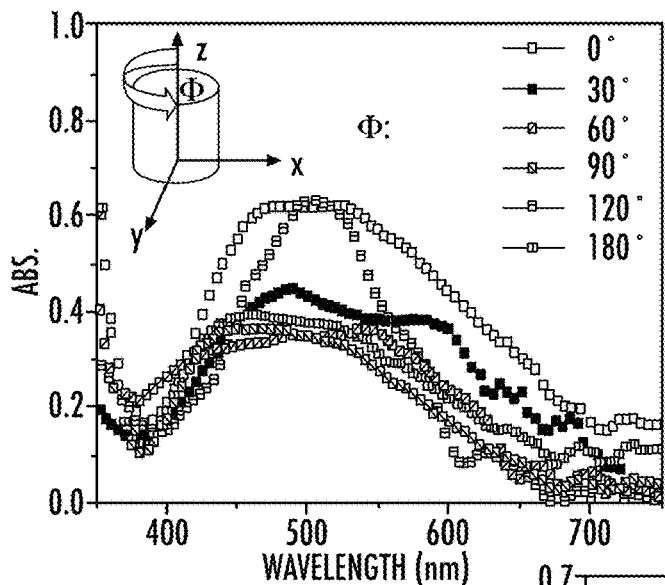
FIGS. 13A-C include FIG. 13A comprising an excitation angle-resolved plasmonic properties of $MoS_2@TiO_2$ (Schematic design of the experimental setup is inserted. The substrate can be rotated clockwise around the z-axis by an angle Φ).

Combining the plasmonic effect with the intrinsic absorption of $MoS_2@TiO_2$, a Full-solar-spectrum harvesting is nearly achieved in this co-catalyst heterostructure. Additionally, the plasmonic resonance is demonstrated to be tunable upon Mo mass loading changes from 10 to 30 nm, with absorption peaks at 420, 480 and 510 nm, accordingly. This process may be similar to the classic size-dependent plasmonic effect. The maximal light harvesting cross-section is obtained in the sample with 30 nm of Mo loading. Control experiments carried out on pure metal-based film (30 nm Mo on $TiO_2$) and oxidized sample ($MoO_3$ on $TiO_2$) give little visible light coverage, but the UV portion from $TiO_2$ substrate. Incident angle and excitation polarization angle-dependent absorption spectra were also tested on $MoS_{2(30)}@TiO_2$ (see FIG. 13A). The resonance wavelengths are independent of the polarization angle (see FIG. 13A). All the absorption peaks of $MoS_{2(30)}@TiO_2$ is located in a range of 450-500 nm at an incident angle of 15°. The absorbance fluctuation (cross-section of curves) may come from the nonuniformity of $MoS_2$ flakes inside $TiO_2$ (as revealed by TEM). Absorption spectra measured at different incident angles were present. The absorption peak position increases from 490 nm to 600 nm with the increase of 0 to 90°.

Figure 13B:
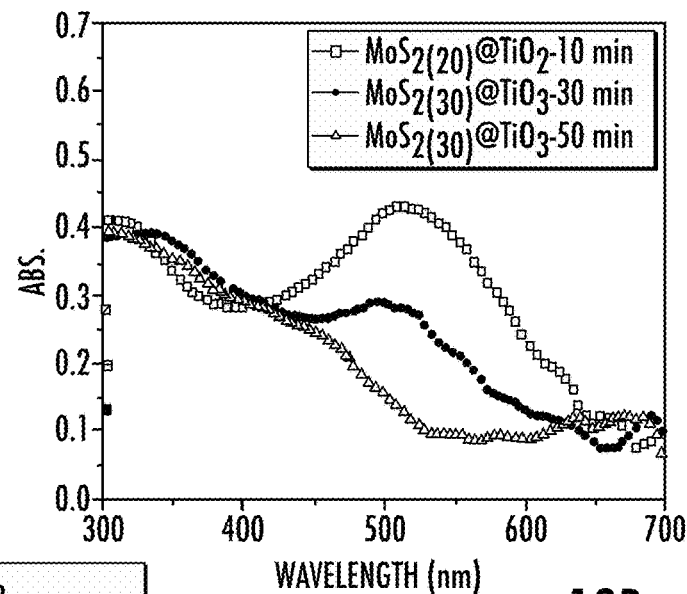
Figure 13C:
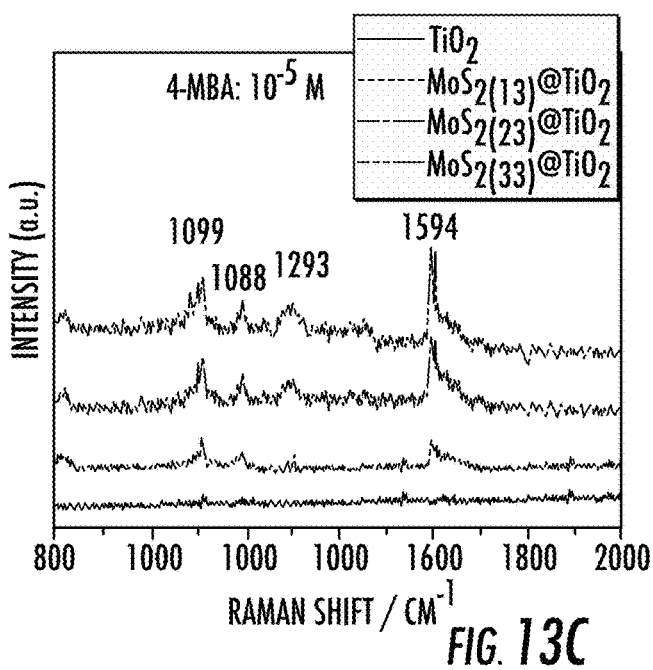

The absorption peak position can further shift backward when the incident angle decreases to 0°. This dynamic shifting indicates that the resonance has 90° difference in the incident angle dependence, suggesting that the orientations of $MoS_2$ flakes affect the resonance modes and charge distribution profiles in the hybrid catalyst. The excitation efficiencies of the samples are also dependent on incident angles. A maximum photo-efficiency (absorption cross-section) is achieved at an incident angle of 30°, consistent with the previous findings that the resonance intensity can be optimized at certain angles. The relationship of nonstoichiometric features to light harvesting was verified by extending the sulfurization time from 10 min to 50 min on $MoS_{2(30)}@TiO_2$ film (see FIG. 13B). A strong absorbance degeneration can be observed with longer reaction times and complementary to the S source within the heterostructure, implying that S-vacancy is the main plasmonic charge donor.

Surface-enhanced Raman scattering (SERS) was used to further determine the enhanced electromagnetic field in the vicinity of $MoS_2@TiO_2$. Mercaptobenzoic acid (4-MBA) was used as the probe molecule with a laser excitation at 630 nm. The dominant peaks found to be at 1099 and 1594 $cm^{-1}$ are attributed to the vibration mode of v8a aromatic ring and breathing mode of v12a ring, respectively. The weak peaks at 1293 and 1188 $cm^{-1}$ are the stretching mode of $v_{(COO-)}$ and deformation mode of C—H, respectively. The stronger SERS signal on a $MoS_2@TiO_2$ substrate (comparing with bare $TiO_2$ nanocavity arrays using $10^{-5}$ mol $L^{-1}$ 4-MBA) demonstrates the plasmonic polarization presented on the $MoS_2@TiO_2$ surface.

Photocatalytic activity of series $MoS_2@TiO_2$ co-catalysts for $H_2$ evolution was estimated under simulated solar light illumination with methanol as a hole scavenger in DI water. Pure $TiO_2$, sulfurized $TiO_2$, and $MoO_3@TiO_2$ hybrid are photocatalytically inert toward hydrogen evolution, with a reaction rate of lower than 10 μmol $h^{-1}$. Noticeably, the photocatalytic activity is sharply enhanced with $MoS_2$ loading and achieves maximal values on the $MoS_{2(30)}@TiO_2$, reaching 84 μmol $h^{-1}$ (≈8 times that of pure $TiO_2$). The photocatalytic activities of the samples increase non-linearly with increasing of $MoS_2$ loading (from 10 to 30 nm Mo deposition) because of the relative lower solar energy input via increasing catalysts amount. Additionally, a deterioration is found with longer sulfurization time from 10 to 50 min ($MoS_{2(30)}@TiO_2$), deducing a weakened plasmonic effect by the stoichiometric assignment, according to spectroscopy analysis (see FIG. 13B). Photocatalytic activities of the samples were obtained, where an optimal photocatalytic activity of 181 μmol $h^{-1}$ $cm^{-2}$ is observed on the heterostructure coated with 30 nm Mo. FIG. 14A shows the rate of $H_2$ production normalized by mass loading of $MoS_2$ (mass-measurement of $MoS_2$ catalyst is given in the experiment section). Samples with 10.2 μg $MoS_2$ has an activity of 580 mmol $h^{-1}$ $g^{-1}$, which is superior to the state-of-the-art photocatalytic systems shown in Table 1 below.

Table 1. Photocatalytic Performance Comparison of Disclosed $MoS_2/TiO_2$ Based Catalyst for $H_2$ Evolution (Bottom Table Entry) to Other Structures.

TABLE 1

| Method | Materials | $H_2$ evolution rate (μmol $h^{-1}$) | Mass activity (μmol $h^{-1}$ $g^{-1}$) |
|---|---|---|---|
| Solvothermal | $MoS_2/C_3N_4$ nanograss | 55.6 | 11.1 |
| CVD | $MoS_2/TiO_2$ nanosheets | 42 | 4,200 |
| Hydrothermal | $MoS_2/TiO_2$ nanorods | 2.7 | 1,500 |
| CVD | $MoS_2/TiO_2$ nanotubes | 0.44 | — |
| CVD | $MOS_2/TiO_2$ nanocavities | 89 | 580,000 |

That may be ascribed to the highly-ordered architecture of $MoS_2$ nanoflakes on $TiO_2$ nanocavities with a lower mass loading, which reduces the electron-hole recombination.

Furthermore, LSPR induced electron energetic level is more negative in the $MoS_{2(10)}@TiO_2$ because of the blue-shifted light harvesting and more negative lowest unoccupied molecular orbital level that favors effective charge utilization rates in $H^+$ reduction. Stability and recyclability of the $MoS_{2(10)}@TiO_2$ co-catalyst were estimated by repeating intermittent $H_2$ evolution under simulated solar light. 90% of incipient production can be kept for the hybrid films even after 21 h. Control experiments were carried out on the samples using $MoS_2$ deposited on compact $TiO_2$ and Mo foils ($MoS_{2(30)}@TiO_{2(compact)}$ and $MoS_2@Mo_{(compact)}$) to further confirm the crucial role of $TiO_2$ nanocavity arrays in the improved photocatalytic stability and recyclability. We found that $MoS_2$ flakes fell off from these compact substrates during $H_2$ evolutions testing, leading to a considerably deteriorated $H_2$ evolution. As shown in FIG. 14B, C, approximately 30% of $H_2$ yield (less than 15 μmol $h^{-1}$) was kept for the $MoS_2@TiO_{2(compact)}$ after 5 circles testing. An even less $H_2$ yield (about 20%, equal to 10 μmol $h^{-1}$) was observed on the $MoS_2@Mo_{(compact)}$ after 15 h testing. These control experiments indicate that $TiO_2$ nanocavity arrays not only contribute to UV-light absorption but also serve as host to immobilize $MoS_2$ co-catalyst.

Photoluminescence (PL) spectrum is used to detect the charge carrier trapping, migration and transfer mechanism during photocatalytic reactions (FIG. 14D, E). The steady-state PL spectra located at 595 nm (FIG. 14D), characterizes remarkable quenching along with the Mo thickening from 10 nm to 30 nm, suggesting either a shorter lifetime or faster trapping of photo-electrons with increasing $MoS_2$ content. Transient-state PL decay curves of $MoS_2@TiO_2$ heterostructures are compared in FIG. 14C. A bi-exponential function was used here for fitting the PL decay curves mathematically:

$$y = A_1 \exp(-x/\tau_1) + A_2 \exp(-x/\tau_2) + y_0 \quad (1)$$

where $A_1$, $A_2$, and $y_0$ are amplitude coefficient and basal constant. $\tau_1$ and $\tau_2$ are fluorescent lifetimes corresponding to non-radiative recombination and inter-band recombination, respectively. The calculated carrier lifetime is inserted in FIG. 14E accordingly. The average fluorescent lifetime of $MoS_{2(10)}@TiO_2$ ($\tau_1$: 2.8 ns and $\tau_2$: 14 ns) is longer than the other ones after integrating by the equation:

$$\tau = \frac{A_1 \tau_1^2 + A_2 \tau_2^2}{A_1 \tau_1 + A_2 \tau_2} \quad (2)$$

This indicates that appropriate $MoS_2$ loading and periodically patterned morphology provide the $MoS_{2(10)}@TiO_2$ film with less trapping centers and prolonged retention of hot electrons, as well as enhanced $H_2$ production.

3.3 Computational Study

The photo-electron arising mechanism, transfer pathway and consuming profile were computationally studied to assist in explaining the excellent photocatalytic activity of $MoS_2@TiO_2$ heterostructures. Firstly, the UV portion of the solar light is mainly absorbed by the $TiO_2$ substrate, where photo-excited electrons transfer to the $MoS_2$ basal plane and diffuse to edge active sites. Here, the designed $MoS_2@TiO_2$ short nanocavity arrays and seamless junctional connection dramatically reduce the charge barriers at active sites. The perpendicular $MoS_2$—$TiO_2$ configuration benefits the electron transfer pathways at the basal plane where a lower resistance and suppressed quenching capture are expected. On the other hand, a broad LSPR band (ranging from 400 to 600 nm) renders the $MoS_2@TiO_2$ heterostructures for visible light-driven $H^+$ reduction. This plasmon-enhanced activity is presumably a result of the aforementioned S-vacancies (confirmed by the STEM) and provides predominant aspects for $H_2$ evolution. Finally, photoelectrons excited on the $MoS_2$ conduction band from NIR light can also contribute to $H_2$ evolution. Although, considerable carrier recombination is unneglectable in this narrow band gap semiconductor. $MoS_2$ edge defects (S-vacancies) play a dominant role in plasmonic resonance and hot electron excitation upon solar light irradiation, but will also capture free carriers and cause unwanted quenching. Moreover, $MoS_2$ and $TiO_2$ intrinsic recombination is another way for hot electron consumption in catalytic processes (dash line between band gap), which may weaken photocatalytic performance.

To have an insightful understanding of the inter-band excitation of $MoS_2$ nanoflakes and eliminate the possibility of $MoS_2$ intrinsic activity in visible-light, electronic band structure was calculated by density functional theory. S-depletion was introduced in the computation models with an atom content of 0%, 8%, 16% respectively, mainly at the edge position. A fundamental band gap around 2.07 eV is found here for a perfect $MoS_2$ crystal, with the highest occupied valence band and the lowest empty conduction band located at 1.63 eV and −0.4 eV, accordingly. The band structure is modulated by introduction of an S-vacancy, which induces the narrowing of the band gap to 1.73 (8%) and 1.12 eV (16%). Moreover, defect states appear near to the Fermi level for the model with 16% S-depletion, which improves the metallic feature and charge mobility of S-depleted $MoS_2$ layers. The overall electronic density of states (DOS) for $MoS_2$ before and after S-depletion were obtained. Defect states near to the Fermi level originate mainly from the d orbitals of Mo and p orbital of S atoms, creating pseudo-ballistic electron transport channels within $MoS_2$. This result is further supported by other literature and fully compatible with optical spectra in the IR region), where the $MoS_2$ band gap absorption peaks are located around 882 nm (1.40 eV). A further conclusion can be deduced from the discussion aforementioned that solar light caused activity of $MoS_2@TiO_2$ films mainly functionalized by the plasmonic effect surrounding $MoS_2$ surface.

To further confirm this assumption, wavelength-dependent photocatalysis and finite element method (FEM) simulations were performed on $MoS_2@TiO_2$ heterostructures under monochromatic light illumination (350-700 nm, with a 50 nm interval). A spectrum dependent $H_2$ evolution rate is revealed over the UV-Vis-NIR region, with a consistent variation in absorption spectra for the $MoS_2@TiO_2$. The largest $H_2$ yield rate is about 59, 73, 86 μmol $h^{-1}$ $mW^{-1}$ $cm^{-2}$ for Mo loading of 10, 20 and 30 nm, respectively, located at 450, 500, 550 nm accordingly. The relative consistency of photo-absorption and $H_2$ production over solar light indicates that the photocatalytic activity enhancement is primarily driven by the plasmonic effect from blue-green wavelengths. Upon excitation by monochromatic light irradiation, the $H_2$ yield is found higher than equivalent solar light (AM 1.5 100 mW $cm^{-2}$) excitation, especially in the 400-600 nm region. This suggests an additional benefit for use of variant colored light for plasmonic material based $H_2$ generation. A 3D model was designed using a single $TiO_2$ nanocavity (50 nm in diameter and 70 nm in length) and three vertically loaded $MoS_2$ nanorods (10 nm in diameter and 20 nm in length) on both sides. It was found that light irradiation coupled with LSPR yields strong electric field enhancements at the tip of $MoS_2$. The field intensity increases with wavelength from 300 to 400 nm and reduces significantly after 500 nm, correlating the LSPR absorption spectra of $MoS_{2(10)}@TiO_2$ film. The maximum electric field enhancement is produced at 400 nm illumination. Field intensity between each antinode covers a distance longer than 5 nm, achieving zero-gap field distribution between $MoS_2$ interspace (<10 nm). Consequently, a 3D electric field distribution is built throughout the networked $MoS_2$ laminate heterostructure and responds strongly to photocatalytic $H_2$ production.

Prospectively, $H_2$ generation from seawater will be highly desirable. However, few studies have focused on the practical photocatalysis on natural seawater because of the barrier blocking of dissolved salt for photocatalytic activity and durability of catalysts. Here it was investigated the effect of salt (mainly NaCl) on photocatalytic activity of $MoS_2@TiO_2$ films with natural seawater (pH: 8.4) splitting under the simulated solar light. Obviously, the activity from seawater decreased markedly compared to that of pure water. Because the isoelectric point of $MoS_2$ is lower than 7 by the plasmonic "hot" electrons on the surface. Electrostatic adherence of hydroxyl group, metal ions, and oxidation of sulfides take place severely in the seawater with a weak alkaline environment. Fortunately, 60% of incipient production is kept for samples, where the highly-ordered architecture may be helpful. This control experiment permits our $MoS_2@TiO_2$ heterostructure as a promising material for $H_2$ production from seawater.

While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents.

The invention claimed is:

1. A heterostructured catalyst, comprising:
a 2-dimensional (2D) array of titanium comprising nanocavities that are all directly attached to a substrate,
wherein each of the titanium comprising nanocavities have a pore with a nanopore size a wall with a nanowall thickness and a wall surface, and further comprising $MoS_2$ nanoflakes extending from the wall surface into the pore.

2. The heterostructured catalyst of claim 1, wherein the 2D array of the titanium comprising nanocavities is a periodically ordered array having an interval of a periodicity of 10 nm to 100 nm with a distribution all within ±1 nm of a mean interval value, the nanopore size is 10 to 200 nm with a distribution all with ±1 nm of a mean pore size value, and the nanowall thickness is 5 nm to 20 nm with a distribution all within ±0.5 nm of a mean wall thickness value.

3. The heterostructured catalyst of claim 1, wherein the $MoS_2$ nanoflakes comprise a 3D laminate structure.

4. The heterostructured catalyst of claim 1, wherein t3D laminate structure comprises 10 layers or less of $MoS_2$ nanoflakes.

5. The heterostructured catalyst of claim 1, wherein the substrate comprises a silicon wafer, a glass wafer, or a conducting polymer.

* * * * *